United States Patent
Amrutur et al.

(10) Patent No.: US 7,973,594 B2
(45) Date of Patent: Jul. 5, 2011

(54) POWER MONITORING FOR OPTIMIZING OPERATION OF A CIRCUIT

(75) Inventors: Bharadwaj Amrutur, Bangalore (IN); Guruaj V. Naik, Bangalore (IN)

(73) Assignee: Indian Institute of Science (IN)

( * ) Notice: Subject to any disclaimer, the term of this patent is extended or adjusted under 35 U.S.C. 154(b) by 24 days.

(21) Appl. No.: 12/551,010

(22) Filed: Aug. 31, 2009

(65) Prior Publication Data
US 2010/0194469 A1    Aug. 5, 2010

(30) Foreign Application Priority Data

Feb. 5, 2009  (IN) .............................. 252/CHE/2009

(51) Int. Cl.
*G05F 1/10* (2006.01)
(52) U.S. Cl. ........................................ 327/544; 327/534
(58) Field of Classification Search .................. 327/534, 327/535, 544
See application file for complete search history.

(56) References Cited

U.S. PATENT DOCUMENTS

| | | | | |
|---|---|---|---|---|
| 5,801,570 A * | 9/1998 | Mizuno et al. | ................ | 327/362 |
| 6,943,613 B2 * | 9/2005 | Miyazaki et al. | ............ | 327/534 |
| 6,967,522 B2 * | 11/2005 | Chandrakasan et al. | ....... | 327/534 |
| 6,985,025 B1 * | 1/2006 | Maksimovic et al. | ........ | 327/540 |
| 7,149,903 B1 * | 12/2006 | Chan et al. | ..................... | 713/300 |
| 7,167,015 B2 * | 1/2007 | Borkar | ..................... | 324/750.03 |
| 7,444,528 B2 * | 10/2008 | Narendra et al. | ............ | 713/320 |
| 7,459,958 B2 * | 12/2008 | Barrows et al. | ................ | 327/534 |
| 7,714,606 B2 * | 5/2010 | Ozawa et al. | .................... | 326/30 |
| 2003/0080802 A1 * | 5/2003 | Ono et al. | ..................... | 327/534 |
| 2005/0225376 A1 * | 10/2005 | Kin Law | ........................ | 327/534 |
| 2008/0141187 A1 * | 6/2008 | Ditzel et al. | ....................... | 716/2 |
| 2008/0191791 A1 * | 8/2008 | Nomura et al. | ................ | 327/540 |
| 2009/0158073 A1 * | 6/2009 | Hsieh et al. | .................... | 713/340 |
| 2010/0045364 A1 * | 2/2010 | Law et al. | ..................... | 327/534 |
| 2010/0327961 A1 * | 12/2010 | Ikenaga et al. | ................. | 327/540 |
| 2011/0069539 A1 * | 3/2011 | Eleftheriou et al. | .......... | 365/163 |

OTHER PUBLICATIONS

Horowitz, et al., "Scaling, Power and the Future of CMOS", 2005 IEEE ISNB 0-7803-9269-8/05.
Markovic, et al., "Methods for True Energy-Performance Optimization", IEEE Journal of Solid-State Circuits, vol. 39, No. 8, Aug. 2004, pp. 1282-1293.
Kao, et al., "A 175-mV Multiply-Accumulate Unit Using an Adaptive Supply Voltage and Body Bias Architecture", IEEE Journal of Solid-State Circuits, vol. 37, No. 11, Nov. 2002, pp. 1545-1554.
Nose et al., "Optimization of Vdd and Vth for Low-Power and High-Speed Applications", 2000 IEEE ISNB 0-7803-5974-7, pp. 469-474.
Wang et al., "Optimal Supply and Threshold Scaling for Subthreshold CMOS Circuits", Proceedings of the IEEE Computer Society Annual Symposium of VLSI, 2002.

(Continued)

*Primary Examiner* — Thomas J Hiltunen
(74) *Attorney, Agent, or Firm* — McDonnell Boehnen Hulbert & Berghoff LLP

(57) ABSTRACT

An example method for optimizing power consumption of digital circuits using dynamic voltage and threshold scaling (DVTS) is provided. A propagation delay of a signal through a portion of the circuit is determined and if the propagation delay does not meet a specified delay requirement, then a supply voltage and/or threshold voltage of the circuit is adjusted. Subsequently, a power consumption level of the circuit is determined and compared to previous power consumption levels. The supply and/or threshold voltage of the circuit can be readjusted to enable the circuit to meet specified power consumption requirements and the specified delay requirement, for example.

26 Claims, 13 Drawing Sheets

OTHER PUBLICATIONS

Wei, et al.,"A Variable-Frequency Parallel I/O Interface with Adaptive Power-Supply Regulation", IEEE Journal of Solid-State Circuits, vol. 35, No. 11, Nov. 2000, pp. 1600-1610.

Mutoh, et al.,"1-V Power Supply High-Speed Digital Circuit Technology with Multithreshold-Voltage CMOS", IEEE Journal of Solid-State Circuits, vol. 30, No. 8, Aug. 1995, pp. 847-854.

Lauwers et al., "Power Estimation Methods for Analog Circuits for Architectural Exploration of Integrated Systems", IEEE Transactions on Very Large Scale Integration (VLSI) Systems, vol. 10, No. 2, Apr. 2002, pp. 155-162.

Ramadass et al., "ISSCC 2007/Session 3/TD: Emerging Devices and Circuits/3.2; Minimum Energy Tracking Loop with Embedded DC-DC Converter Delivering Voltages down to 250mV in 65nm CMOS", 2007 IEEE International Solid-State Circuits Conference, Feb. 12, 2007.

Masahiro Nomura et al., "Delay and Power Monitoring Schemes for Minimizing Power Comsumption by Means of Supply and Threshold Voltage Control in Active and Standby Modes," IEEE J. Solid-State Circuits, vol. 41, No. 4, Apr. 2006.

* cited by examiner

POWER MONITORING FOR OPTIMIZING OPERATION OF A CIRCUIT

CROSS-REFERENCE TO RELATED APPLICATION

The present application claims priority under 35 U.S.C. §119 to a corresponding patent application filed in India and having application number 252/CHE/2009, filed on Feb. 5, 2009, the entire contents of which are herein incorporated by reference.

BACKGROUND

Power consumption of integrated circuits is a concern in battery operated portable system designs. With technology scaling, the power consumption of integrated circuits is becoming more of a concern of designers. Power optimization is performed at different levels of a system design while trading-off various design parameters like supply voltage, well bias voltage, transistor sizing, circuit style, and micro-architecture, for example. One power management technique is to lower a supply voltage because this may give more than a linear savings in power. However, an increase in leakage power with scaling can result, which has led to dynamic voltage and threshold scaling (DVTS) where both supply voltage and substrate biases (e.g., threshold voltages) of a circuit are controlled to reach a power optimum point (POP). Power savings in computationally intensive circuits, such as for example, motion estimators and moving picture experts group (MPEG) codecs, which have significant fluctuations in their activity and performance requirements, can be improved with DVTS, for example.

For power optimization during super-threshold operations of transistors, a ratio of active power to leakage power can be close to constant at a power optimum usage. Systems with DVTS have been implemented by maintaining the constant power ratio over a range of operating frequencies. However, the DVTS implementation may not measure active power or leakage power of the actual system in order to maintain the constant power ratio. Instead, DVTS implementations usually measure the active power or leakage power of the actual system indirectly by using mimic circuits. But, enabling the mimic circuit to track the power consumption of the actual system across process, voltage, temperature and activity variations can be difficult due to the complex nature of the actual system. For example, the actual system can be very complex and may include hundreds of thousands of logic gates (of all variations) configured in a complicated network. The mimic circuit would need to be smaller to reduce overhead and costs, and creating a smaller mimic circuit that will accurately model power dissipation of the actual system can be difficult and inherently error prone due to differences in scale and complexity of the two circuits. Furthermore, power dissipation of the actual system may vary due to input data patterns, and attempting to replicate such variation within the mimic circuit can lead to many errors.

Additionally, active power mimic circuits may only work in super-threshold operation because in a sub-threshold operation (and particularly weak inversion region operations), the active power to leakage power ratio at optimum power varies from constant. For example, when supply voltages are reduced to small values (e.g., essentially lower than the threshold voltage of the transistor), transistors in the circuit will operate in a sub-threshold regime in which the active power to leakage power ratio at optimum power varies from constant. However, when the supply voltage is higher than the threshold voltage, the operation will be in a super-threshold regime.

In deep-sub-micron technologies that have supply voltages as low as 1 volt, for example, digital circuits can span operation from super-threshold to near/sub-threshold regions for wide ranges of performance specifications.

SUMMARY

A power optimization strategy that reaches a power optimal point irrespective of region of operation is described. An example implementation of dynamic voltage and threshold scaling (DVTS) is presented that includes a power monitor technique.

In one aspect, a method for optimizing power consumption of a circuit is provided that includes determining a propagation delay of a signal through a portion of the circuit. If the propagation delay does not meet a specified delay requirement, a supply voltage of the circuit is adjusted. The method also includes determining a power consumption level of the circuit. If the power consumption level of the circuit is greater than a previous power consumption level, a threshold voltage of the circuit is adjusted in a negative manner as compared to a previous adjustment of the threshold voltage. If the power consumption level of the circuit is less than the previous power consumption level, the threshold voltage of the circuit is adjusted in a positive manner as compared to the previous adjustment of the threshold voltage.

In another aspect, a method for optimizing power consumption of a circuit is provided that includes setting a supply voltage and a threshold voltage of the circuit to result in a specified propagation delay of a signal through a portion of the circuit. The method also includes determining a first power consumption of the circuit, adjusting the threshold voltage, and adjusting the supply voltage in a manner to maintain the specified propagation delay of the signal through the portion of the circuit. The method further includes determining a second power consumption of the circuit, and if a difference between the first power consumption and the second power consumption does not meet a specified power requirement, the threshold voltage is adjusted.

In yet another aspect, a power optimization circuit for optimizing power consumption of a circuit is provided that includes a power monitor, a delay monitor and a controller. The power monitor determines a power consumption level of the circuit, and the delay monitor determines a propagation delay of a signal through a portion of the circuit. The controller is coupled to the power monitor and the delay monitor. The controller determines if the propagation delay meets a specified delay requirement, and if not, adjusts either a supply voltage or a threshold voltage of the circuit. The controller further determines if the power consumption level of the circuit meets a specified power requirement, and if not, readjusts either the supply voltage or the threshold voltage of the circuit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
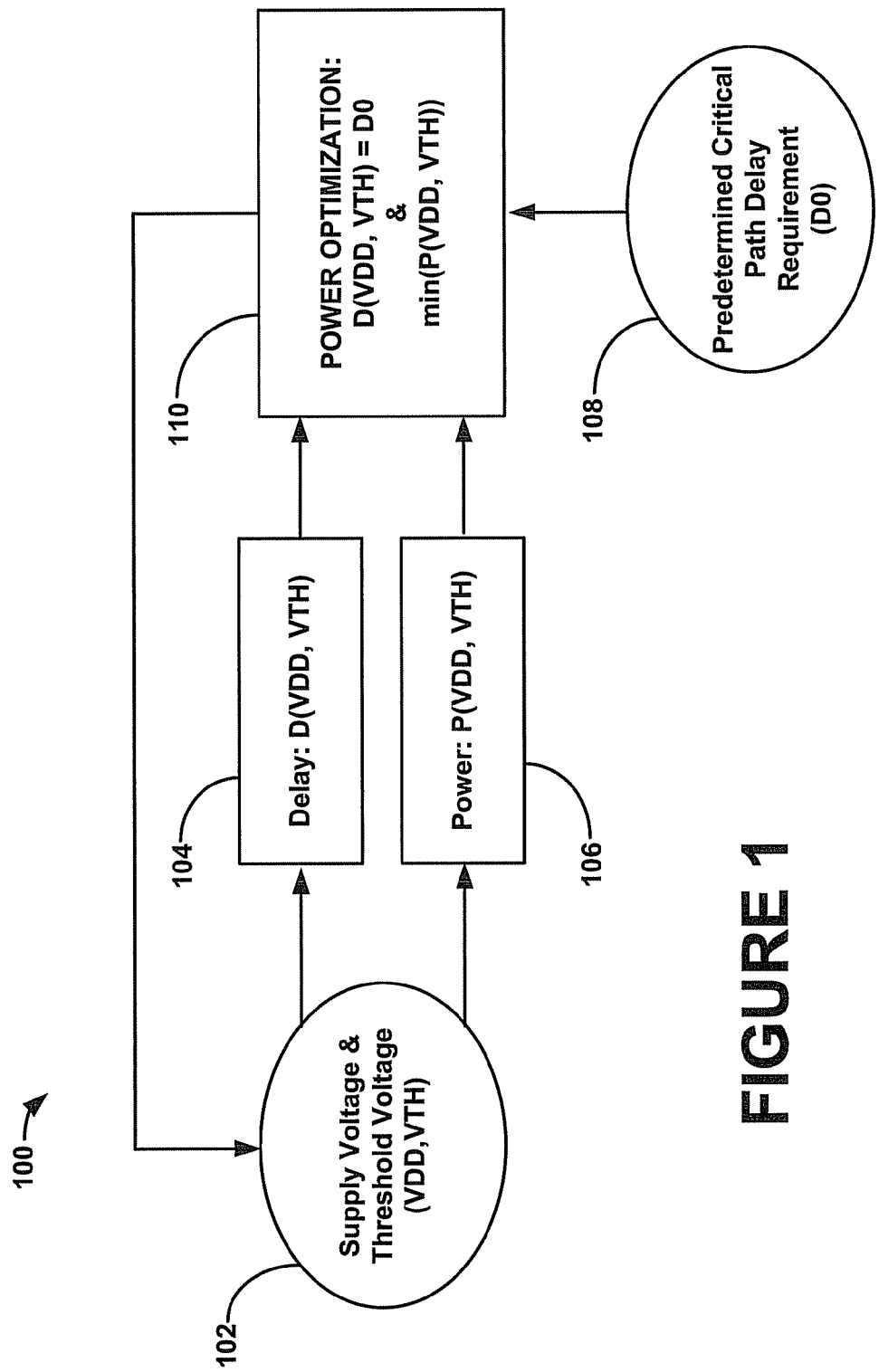
FIG. 1 is an example process block diagram of a power optimization strategy.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

Embodiments described below relate to a power optimization circuit including transistors that operate in both super-threshold and sub-threshold regions, and more particularly, to a dynamic voltage and threshold scaling strategy (DVTS) and a power difference measuring power monitor.

Dynamic voltage scaling is a power management technique in computer architecture where voltage used in a component is increased or decreased depending upon circumstances. Dynamic voltage scaling to increase voltage is known as overvolting and dynamic voltage scaling to decrease voltage is known as undervolting. Undervolting is generally performed to conserve power, particularly in laptops and other mobile devices, where energy comes from a battery and thus is limited. Overvolting is generally performed to increase computer performance.

MOSFET-based digital circuits operate using voltages at circuit nodes to represent a logical state. The voltage at the nodes switches between a logic high voltage and a logic low voltage during operation, e.g., when inputs to a logic gate transition, the transistors comprising the gate may toggle the gate's output.

At each node in a circuit is a certain amount of capacitance, which arises from various sources, mainly transistors (primarily gate capacitance and diffusion capacitance) and wires (coupling capacitance). Toggling a voltage at a circuit node requires charging or discharging the capacitance at the node, and since currents are related to voltage, the time to toggle the voltage depends on the voltage applied. By applying a higher voltage, the capacitances are charged and discharged more quickly, resulting in faster operation of the circuit and allowing for higher frequency operation.

The switching power dissipated by a circuit using static CMOS gates is about $(C) \times (V^2) \times (freq)$, where C is the capacitance being switched per clock cycle, V is voltage, and freq is the switching frequency. Thus, switching power decreases quadratically with voltage. Switching power of the circuit may include other contributions as well depending on types of gates used and configurations of the gates, for example. Also, a static leakage current may be present that has more of an effect as a size of the circuitry decreases. However, when leakage current becomes a significant factor in terms of power consumption, circuitry may be designed so that portions of the circuit can be powered off, for example.

Dynamic voltage scaling can be used to manage switching power consumption. Low voltage operation may be desired to minimize power consumption associated with circuitry, and only when significant computational power is needed may voltage be increased, for example. However, the speed at which a digital circuit can switch states (e.g., transition from a logic low (VSS) to a logic high (VDD) or vice versa) is proportional to a voltage differential in the circuit. Reducing the voltage can reduce a switching speed of the circuit, and thus, reduce a maximum frequency at which the circuit can perform. This, in turn, can reduce a rate at which program instructions can be issued and executed. Thus, determining an optimized voltage level at which a switching speed is acceptable and power consumption levels are acceptable is desired.

Further, dynamic voltage scaling can be used to prevent computer system overheating, which can result in program or operating system crashes, and possibly hardware damage. Reducing voltage supplied to circuits can decrease a temperature of the circuits. However, decreasing the voltage too low can result in system instability.

To implement a DVTS power optimization circuit that operates in both super-threshold and sub-threshold regions, a power optimization algorithm is described. Initially, operating characteristics for a circuit are specified, including, for example, specified delay requirements and power consumption requirements. Subsequently, supply and threshold voltages of the circuit are adjusted to maintain the delay requirements. Power consumption of the circuit can then be measured to determine if the circuit operates within the acceptable levels, and if not, the supply and threshold voltages can be readjusted within limits to maintain the specified delay requirements to attempt to achieve the specified power requirements. In one embodiment, the supply and threshold voltages will eventually be set at or be substantially adjusted to a level so that the circuit operates at a power optimum point (POP).

A power optimum point (POP) can be defined, for example, as a minimum level of power being consumed by a circuit, while the circuit operates at a predetermined performance level or according to predetermined specifications. In this manner, power is conserved but the circuit still operates as desired. FIG. 1 is an example process flow diagram 100 of a power optimization strategy for a given circuit. The circuit will require a supply voltage $V_{DD}$ and a threshold voltage $V_{th}$ input 102. A critical path delay $D_0$ of the circuit can be determined and provided as an input 108 to the power optimum strategy as well. A critical path of a circuit may be considered a longest combination path between two nodes in the given circuit. Thus, a critical path delay D quantifies a propagation delay of a signal that traverses the longest combination, and gives a reference to the performance level of the given circuit as the operating speed of the given circuit. Therefore, the predetermined performance level of the circuit can be considered to be defined by the predetermined critical path delay $D_0$ of the given circuit.

The supply voltage $V_{DD}$ and threshold voltage $V_{th}$ input 102 are received by a critical path delay D calculation step 104 and a power P calculation step 106, as both power consumption P and critical path delay D of a given circuit depend on the supply voltage $V_{DD}$ of the circuit and the threshold voltage $V_{th}$ of the circuit. The predetermined critical path delay $D_0$ and the outputs of the critical path delay D calculation step 104 and the power P calculation step 106 are received by a power optimization block 110. The power optimization block 110 optimizes consumption of power for the circuit operating at a predetermined critical path delay $D_0$ as follows:

$$\text{Min}\{P(V_{DD}, V_{th})\} \text{ with } D(V_{DD}, V_{th}) = D_0 \quad \text{Equation (1)}$$

where $P(V_{DD}, V_{th})$ is the power consumed by a circuit as a function of $V_{DD}$ (e.g., supply voltage) and $V_{th}$ (e.g., threshold voltage), $D(V_{DD}, V_{th})$ is the critical path delay of the circuit as a function of $V_{DD}$ and $V_{th}$, and $D_0$ is a constant.

Equation (1) can be rewritten as follows:

$$d[P(V_{DD}, V_{th}) + \lambda D(V_{DD}, V_{th})] = 0 \quad \text{Equation (2)}$$

where $\lambda$ is Lagrange's undetermined multiplier, and d represents the derivative function. Using standard optimization theory, such as applying the Pareto optimal condition analysis, Equation (2) will become the following with optimal conditions:

$$\frac{\partial P / \partial V_{DD}}{\partial D / \partial V_{DD}} = \frac{\partial P / \partial V_{TH}}{\partial D / \partial V_{TH}} \quad \text{Equation (3)}$$

In super-threshold operating regions, Equation (3) reduces to a ratio of active power to leakage power that holds constant at about 2. But, when a circuit operates in a sub-threshold region, a current to switch on transistors (such as metal-oxide semiconductor field effect transistors (MOSFET)) depends exponentially on both supply voltage $V_{DD}$ and threshold voltage $V_{th}$. For example, in sub-threshold operation, the supply voltage is usually small and resulting currents are also small. The transistors are not fully on, unlike in super-threshold operation. This type of operation is used to obtain low power operation. However, the speeds are also slower, which may be acceptable for certain applications. Typically, in super-threshold operation, the ratio of on-to-off currents in a transistor is at least 1000 or more, while in the sub-threshold operation, since the transistors are not fully on, the ratio is smaller. Thus, using a fixed ratio for leakage to dynamic power may not give the best power optimal solution. As a result, the ratio of active power to leakage power at a power optimum condition (e.g., according to Equation (3)) changes and the condition expressed in Equation (3) can be generalized as discussed below.

If $V_{DD}$ and $V_{th}$ are varied such that delay is held constant during circuit operation, then Equation (3) would reduce to:

$$\partial P / \partial V_{DD} = \partial P / \partial V_{th} = 0 \text{ or } dP(V_{DD}, V_{th}) = 0 \quad \text{Equation (4)}$$

Equation (4) gives the condition for reaching a power optimum point (POP) with the performance of the circuit unchanged (e.g., constant critical path delay). This condition can be formulated as an algorithm for a power optimization strategy. The calculated $V_{DD}$ and $V_{th}$ values can be fed back to the supply voltage $V_{DD}$ and threshold voltage $V_{th}$ input 102 so as to operate the circuit at a power optimum point.

Figure 2:
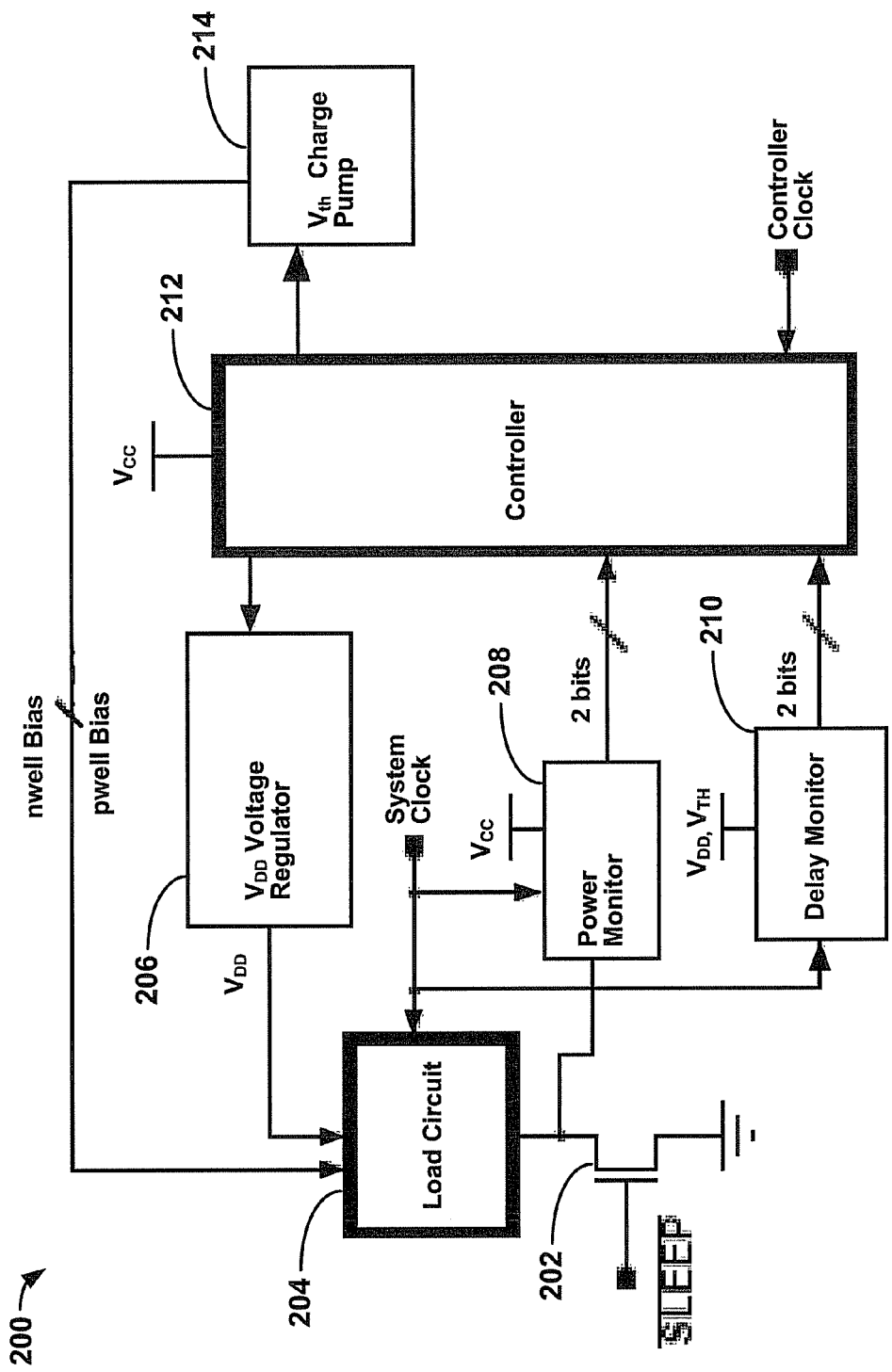
FIG. 2 is a block diagram of an example dynamic voltage and threshold scaling circuit.

FIG. 2 is a block diagram of an example dynamic voltage and threshold scaling circuit configuration 200. The DVTS circuit configuration 200 comprises an NMOS sleep transistor switch 202, a load circuit 204, a $V_{DD}$ voltage regulator 206, a power monitor 208, a delay monitor 210, a controller 212, and a $V_{th}$ charge pump 214. The NMOS sleep transistor switch 202 is coupled with the load circuit 204 and the power monitor 208. The load circuit 204 receives inputs from the $V_{th}$ charge pump 214, the power monitor 208, the delay monitor 210, and the $V_{DD}$ voltage regulator 206. The $V_{DD}$ voltage regulator 206 receives an input from the controller 212, while the power monitor 208 and delay monitor 210 each receive an input from the load circuit 204. The controller 212 receives inputs from both the power monitor 208 and the delay monitor 210, while the $V_{th}$ charge pump 214 receives an input from the controller 212. The power monitor 208, the controller 212 and the NMOS sleep transistor switch 202 are powered by a fixed power supply, $V_{CC}$.

The load circuit 204 represents a digital circuit whose power consumption is to be minimized, and the load circuit 204 is energized by a variable power supply $V_{DD}$, which is obtained from the $V_{DD}$ voltage regulator 206 in the circuit 200. The threshold voltage $V_{th}$ of transistors in the load circuit 304 is altered by changing n-well and p-well biases derived from the $V_{th}$ charge pump 214. The clock clk to the load circuit 204 is applied externally at a frequency $f_{sys}$, for example.

The delay monitor 210 includes a critical path mimic circuit energized by $V_{DD}$ and $V_{th}$ of the load circuit 204. The critical path mimic circuit includes a conceptual reproduction, or a substitute for a critical path that is present in the load circuit 204. Examples of delay monitors are discussed below. The delay monitor 210 can use the mimic circuit to estimate a delay of the load circuit 204. The delay may be a set time or a range of time. Use of a critical path mimic circuit as part of the delay monitor 210 can be beneficial due to complexity of the load circuit 204. However, other methods to monitor the delay of the actual circuit are available as well. The delay monitor 210 outputs two bits to the controller 212 indicating whether the delay of the critical path is lower, higher or within a tolerance window, dp.

Standby leakage power management dictates use of the NMOS sleep transistor switch 202, which is turned off during standby mode, and is turned on in an active mode to perform as a resistor. For example, in a standby mode of a chip or 1a logic block, a logic block may not be used for any computations. In such a situation, any leakage currents flowing through the logic block are unused energy. Thus, to reduce leakage power consumption during inactivity, the NMOS sleep transistor switch 202 receives a signal at its gate turning the switch off. Hence, current drawn by the load circuit 204 can be directly measured by measuring a voltage drop across the NMOS sleep transistor switch 202.

The power monitor 208 measures a change in power $\Delta P$ consumed by the load circuit 204 periodically by comparing a current or present power consumption with a power consumption measured previously. The power monitor 208 will compare the $\Delta P$ with a tolerance window dp. The power monitor 208 then outputs two bits indicating if $\Delta P < -dp$, $\Delta P > dp$, or $-dp < \Delta P < dp$. The value of dp may be determined by a resolution of the measurement apparatus and the supply regulators. For example, a system using a 1V supply voltage and consuming 1 A current is dissipating 1 W of power. If the $V_{DD}$ voltage regulator 206 allows 10 mV incremental steps, then power consumption can change by increments of at least 10 mW. Thus, the resolution of dp may be less 10 mW, and could be smaller by at least a factor of 2, for example.

The power monitor 208 may make measurements of power consumption as often as desired, and the frequency of measurements may be determined based on a speed of adjustment of supply and substrate voltages. For example, once a command is given to the $V_{DD}$ voltage regulator 206 to change the supply voltage, a small amount of time is needed for the voltage to stabilize, such as about a few microseconds.

The controller 212 operates to optimize operation of the load circuit 204 by minimizing power consumption of the load circuit 204. Lowering a supply voltage ($V_{DD}$) has been found to be an effective manner to decrease power consumption of circuits, since complementary metal-oxide semiconductor (CMOS) power quadratically depends on $V_{DD}$. Low $V_{DD}$, however, can degrade performance of the circuit. It is possible to maintain a performance of the circuit by decreasing the threshold voltage ($V_{th}$) at the same time as decreasing $V_{DD}$, but then the sub-threshold leakage power can increase exponentially. Therefore, there are optimum $V_{DD}$ and $V_{th}$ values that achieve required performance and lowest power consumption, and the controller 212 operates to determine the optimum $V_{DD}$ and $V_{th}$ values.

The controller 212 may be a finite state machine (FSM) that coordinates operations of the $V_{DD}$ voltage regulator 206 and the $V_{th}$ charge pump 214 with inputs from the power monitor 208 and the delay monitor 210. The controller 212 operates on a control clock that has a fixed frequency that is independent of a system clock. The control clock frequency may be lower than the system clock frequency since a speed of the DVTS control scheme is limited by a response time of the voltage regulator 206 and the $V_{th}$ charge pump 214.

Alternatively, the controller 212 may be embodied as a processor that accesses memory to execute software functions stored therein. One skilled in the art of computer systems design will understand that the example embodiments are not limited to any particular class or model of processor. The processors may operate according to an operating system, which may be any suitable commercially available embedded or disk-based operating system, or any proprietary operating system. Further, the processors may comprise one or more smaller central processing units, including, for example, a programmable digital signal processing engine or may also be implemented as a single application specific integrated circuit (ASIC) to improve speed and to economize space. In general, it should be understood that the controller 212 could include hardware objects developed using integrated circuit development technologies, or yet via some other methods, or the combination of hardware and software objects that could be ordered, parameterized, and connected in a software environment to implement different functions described herein. Also, the hardware objects could communicate using electrical signals, with states of the signals representing different data.

Furthermore, the controller 212 may include or have access to memory that stores information such as previous power consumption measurements of the circuit 200 (as determined by the power monitor), previous delay measurements (as determined by the delay monitor 210), and other input or specified performance characteristics of the load circuit 204, for example. The memory may include random access memory (RAM), flash memory or long term storage, such as read only memory (ROM) or magnetic disks, for example.

The controller 212 receives inputs from the power monitor 208 indicating the critical path delay of the load circuit 204, and initially sets the supply voltage ($V_{DD}$) to a voltage that corresponds to the critical path delay being a constant $D_0$. Example values of $V_{DD}$ can be obtained in situ using feedback in the circuit including the delay monitor 210 and the power monitor 208. $V_{DD}$ can be selected to be small enough to meet a target delay, for example.

Once the delay constraint is met, the controller 212 instructs the $V_{th}$ charge pump 214 to increase or decrease the well bias threshold voltage $V_{th}$ by a $\Delta$Vth amount. Subsequently, the supply voltage $V_{DD}$ can be adjusted to maintain the same delay constant, $D_0$.

The power monitor 208 then measures a change in power $\Delta$P consumed by the load circuit 204 by comparing a current or present power consumption with a power consumption measured previously. If $\Delta$P is within a given allowable range, the load circuit 204 is considered to be operating at a power optimum point. However, if the current power sample is greater than the previous power sample by more than a tolerance window dp, the well bias voltage is adjusted again by an amount $-\Delta V_{th}$, the supply voltage $V_{DD}$ will be adjusted again to maintain the constant delay, and a new change in power is again compared to the allowable range. Conversely, if the current power sample is less than the previous power sample by more than the tolerance window dp, the well bias voltage is readjusted by $\Delta V_{th}$, the supply voltage $V_{DD}$ will be readjusted, and a new change in power is again compared to the allowable range.

Eventually, a given well bias $V_{th}$ and supply voltage $V_{DD}$ will be obtained to achieve the identified critical delay constant, and the load circuit 204 will then be operating at a power optimum point.

Note that a change in power is compared to a tolerance window dp, however, it may also be that only a magnitude of a new power sample is compared to a threshold to determine whether to continue to adjust the supply and threshold voltages. For example, if a magnitude of a power consumption is above or below a preset threshold level (depending on the specific circuit and application of the circuit), then the voltages can be readjusted. Still, alternatively or in addition, a magnitude of power consumption may be compared to a threshold level and also with previous levels of power consumption to determine a change in power due to the change in supply and threshold voltages, and the change in power may be compared to a threshold or tolerance window as well. Any combination of comparisons may be performed to determine or ascertain whether the load circuit is considered to be operating at a power optimum point.

A simulation of the DVTS circuit 200 of FIG. 2 was performed at two levels of abstraction, e.g., a circuit level and a system level. The circuit simulation was performed in HSPICE for individual blocks of the DVTS system and transfer curves were exported to MATLAB. Power and delay numbers of the load circuit 204 were obtained from exhaustive simulations using HSPICE results exported to MATLAB. The system level simulations were performed in MATLAB abstracting individual blocks with transfer curves. All circuit simulations in HSPICE were performed using 65 nm predictive technology model (PTM) files.

For the simulation, the load circuit 204 was a 16×16 array of adders used for implementing array multipliers. The circuit specifications were $V_{DD,max}=1.0V$, $V_{nwell}=-0.5V$ to 1.5V and $V_{pwell}=-0.5V$ to 0.5V. The control clock was set at $f_{cntrl}=1$ MHz. Simulation results of throughput versus optimal $V_{DD}$ and optimal $V_{pwell}$ are tabulated below in Table 1. Table 1 gives a comparison of the power overhead for the DVTS circuit versus the power of the load circuit 204. The power numbers of the load circuit 204 are scaled by 1 V/$V_{DD}$ to account for the less than 100% efficiency of the $V_{DD}$ voltage regulator 206.

TABLE 1

HSPICE SIMULATION RESULTS

| Frequency (MHz) | Optimal $V_{DD}$ (V) | Optimal $V_{pwell}$ (V) | Power Consumed by Load Circuit (mW) | Power Consumed by DVTS Controller (µW) | Power Consumed by Power Monitor (µW) |
|---|---|---|---|---|---|
| 1000 | 0.66 | 0.05 | 4.671 | 24.4 | 0.587266 |
| 500 | 0.56 | 0 | 1.697 | 13.45 | 0.629305 |
| 200 | 0.53 | −0.35 | 0.581 | 6.69 | 0.654717 |
| 70 | 0.45 | −0.35 | 0.157 | 3.22 | 0.93579 |
| 10 | 0.3 | −0.35 | 0.0093 | 1.68 | 1.47723 |

Figure 3:
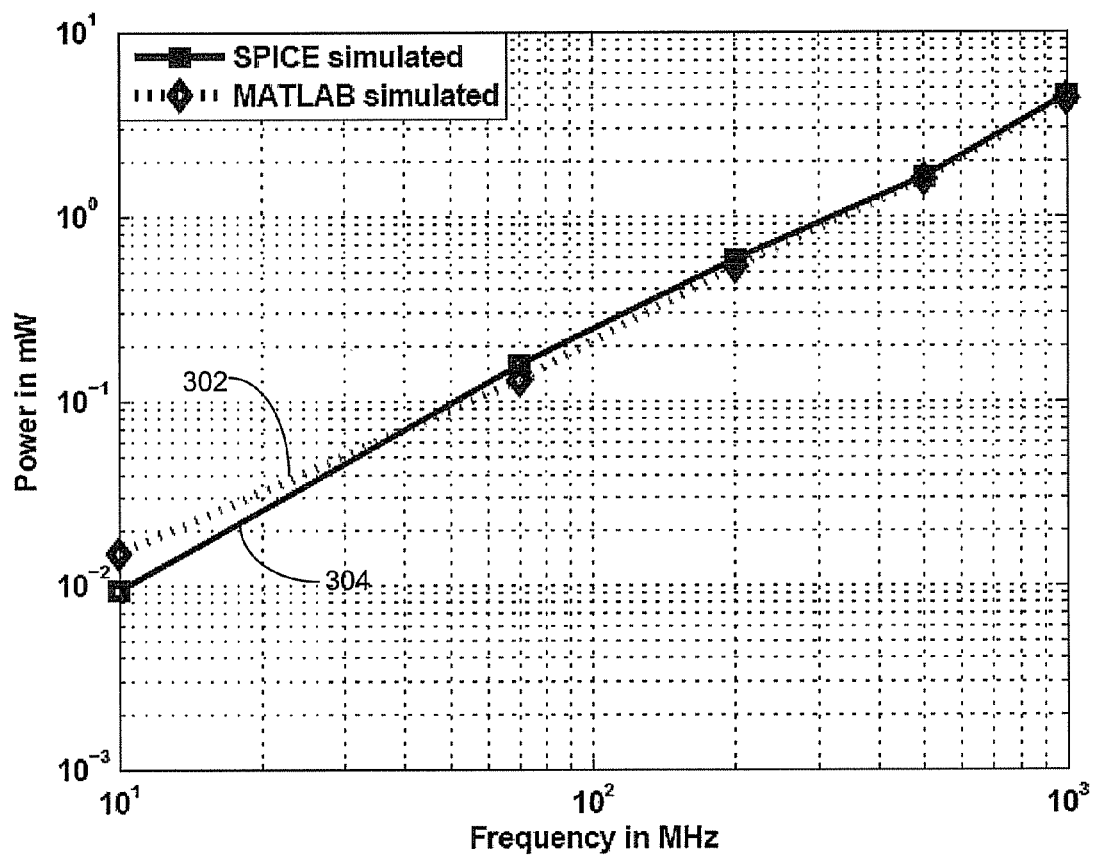
FIG. 3 is a graphical representation of example simulated relationships between power and frequency for an example DVTS controlled circuit.

The optimal $V_{DD}$ and $V_{pwell}$ are obtained by operating the circuit 200 according to the functionality described above. For example, initially a supply voltage ($V_{DD}$) is set that corresponds to a critical path delay being a constant $D_0$, and then the $V_{th}$ is increased or decreased to seek the optimal level. Subsequently, the supply voltage $V_{DD}$ is readjusted to maintain the same delay constant, $D_0$, and the power consumed by the load circuit is checked to determine if the power is within an allowable range. If not, the $V_{th}$ and $V_{DD}$ are readjusted within limits of maintaining the delay constant, $D_0$, and the consumed power is checked again. This algorithm is an iterative process and continues until values $V_{th}$ and $V_{DD}$ are obtained that give a power consumption within an allowable range, within the limits of maintaining the delay constant, $D_0$. Example values of optimal $V_{th}$ and $V_{DD}$ for an example load circuit of 16×16 array of adders are given above in Table 1. These values are inputted to an HSPICE simulation to obtain the power of the load circuit 204 and the power of the rest of the DVTS peripherals. By plotting the example simulated relationships between power and frequency obtained from the simulations, a near linear relationship between power and frequency for a DVTS controlled circuit is obtained, as shown in an example plot illustrated in FIG. 3.

Figure 4:
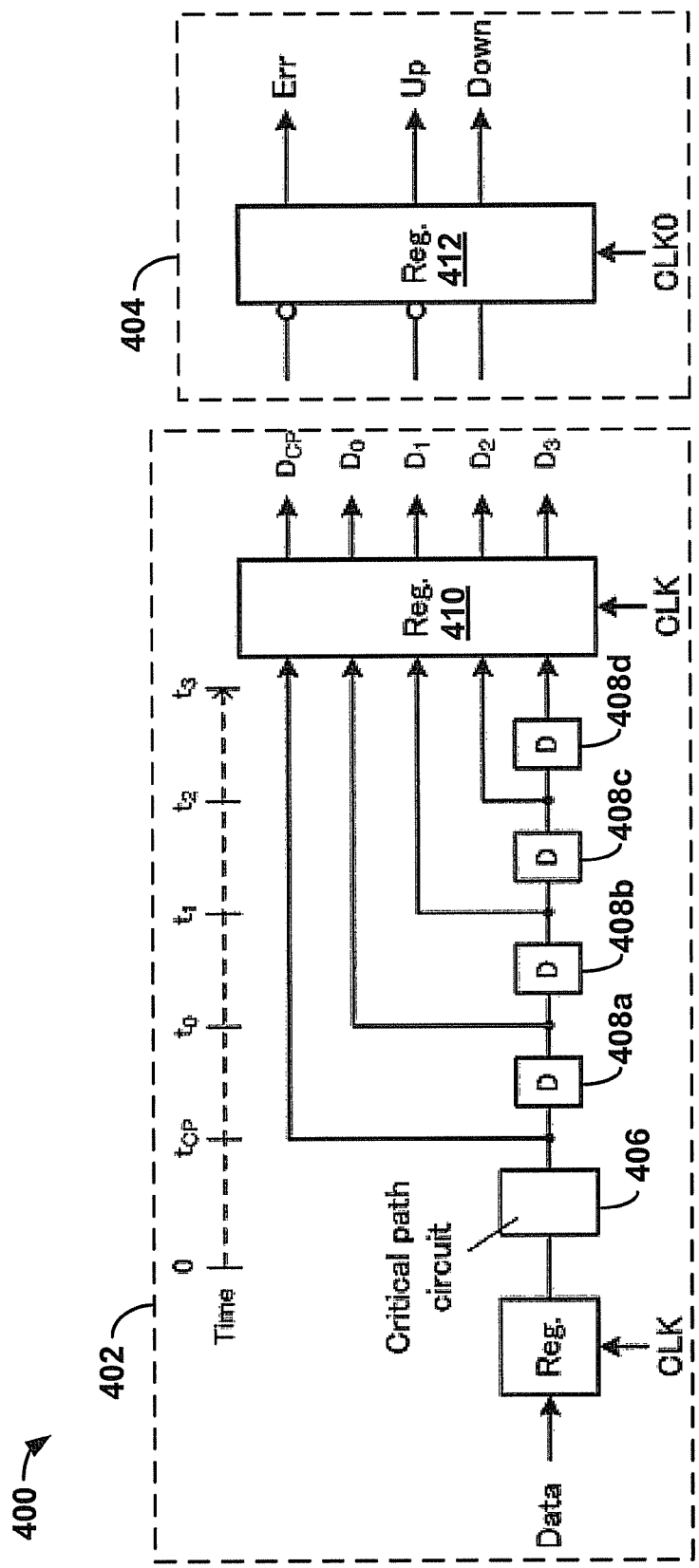
FIG. 4 is a block diagram of an example delay monitor.

FIG. 4 is a block diagram of an example delay monitor 400. A delay of an actual circuit under test would ideally be monitored, however, monitoring the delay of the actual circuit can be complicated and difficult to achieve at run time. For example, within the actual circuit under test, there could be a multiplicity of critical paths in the actual circuit and all of these critical paths would need to be monitored.

Instead, the delay monitor 400 is tuneable to match or substantially match a delay of the actual circuit. The delay monitor 400 may be constructed after simulating delays observed by the actual circuit, for example, so that the delay monitor 400 can include a delay mimic circuit. A replica of a critical delay path has been found to be an accurate way to measure delay variation with respect to different process corners and variations in operating conditions in a circuit under test.

The delay monitor 400 includes a delay detector 402 and a $V_{DD}/V_{th}$ control switching block 404. The delay detector 402 includes a critical path circuit 406, delay circuits (D) 408a-d, and registers 410. CLK is a clock signal of the delay detector 402, CLK0 is a sampling clock for $V_{DD}/V_{th}$ control, and Data is a one-shot pulse signal in a cycle of CLK synchronous CLK0s. $D_{CP}$ and $D_{0-3}$ are comparator result signals indicating differences between $T_{CLK}$ clock period and various path delays that include delay margins $t_{CP}$ and $t_{0-3}$, respectively, where $t_{CP}$ is delay in a critical path replica. If t*<$T_{CLK}$ is true, D* will be 1. Up, Down, and Err are control signals used in $V_{DD}$ control. If $D_1$=1, Up will be 1. If $D_2$=1, Down will be 1.

The delay monitor 400 can detect a relationship between a clock cycle time and a propagation delay in the critical path circuit and control the $V_{DD}$ controller and the $V_{DD}/V_{th}$ control switching block 404. The $V_{DD}/V_{th}$ control switching block 404 selects either $V_{DD}$ control or $V_{th}$ control, for separate operations, to avoid possible oscillation problem between the two.

The $V_{DD}/V_{th}$ control switching block 404 includes logic gates and a register 412. $D_{0-3}$ are delay detector 402 results. Up=1 indicates the $V_{DD}$ control mode and Down=1 indicates the $V_{th}$ control mode.

The critical path replica circuit 406 reflects delay characteristics of critical paths under process, voltage, and temperature (PVT) changes conducted to reduce delay margin and to achieve lower power consumption. The critical path replica circuit 406 may include gate delay, RC delay, and rise/fall delay components, for example. One example of a critical path replica circuit includes a 2-input NAND gate delay, but other replicas can be implemented as well as the occasion demands and can be determined through simulations of the actual circuit under test.

In another embodiment, the delay monitor may include inverters as unit delay elements that accurately match delays of various other circuit elements under the same operating conditions. A series of inverters whose delay nominally matches critical path delays of the circuit under test can be used to measure circuit performance. Using supply controlled inverters as delay elements enables a delay of all circuit elements operating at the same control voltage to be a fixed percentage of the clock period, which allows replacement of precision analog circuit blocks with digital gates, for example. Other types of delay monitoring circuits, and critical path replica circuits are possible as well. Any logic gate configuration may be employed as a critical path replica circuit based on simulations of the circuit under test to identify a critical delay path. Thus, the delay monitor circuit operates to mimic or simulate a critical path of circuitry within the actual circuit to simulate delays observed by the actual circuit via the critical path or via a substantially critical path, for example.

Figure 5:
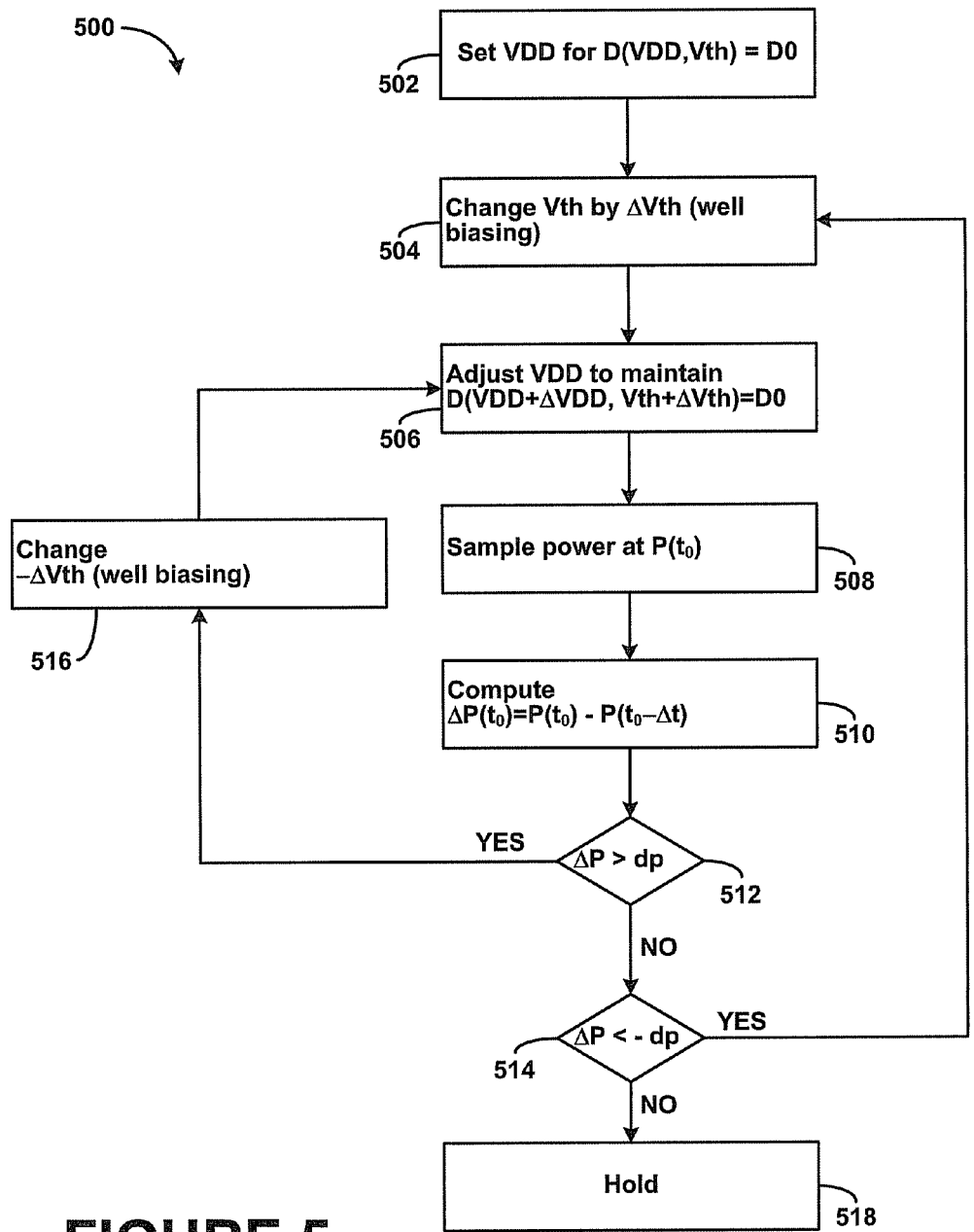
FIG. 5 is an example process flow diagram of a power optimization algorithm.

FIG. 5 is a process flow diagram 500 of an example power optimization algorithm, as implemented in the DVTS circuit 200. It should be understood that the flow diagram shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. In addition, each block may represent circuitry that is wired to perform the specific logical functions in the process. Alternative implementations are included within the scope of the example embodiments of the present application in which functions may be executed out of order from that shown or discussed, including substantially concurrent or in reverse order, depending on the functionality involved, as would be understood by those reasonably skilled in the art.

Initially, as shown at block 502, a supply voltage ($V_{DD}$) is set to a constant $D_0$. Since $V_{DD}$ may have a greater control over the delay of the circuit as compared to $V_{th}$, a delay constraint can be met by adjusting or setting a value for $V_{DD}$. Once the delay constraint is met, the well bias threshold voltage $V_{th}$ is increased or decreased by a $\Delta V$th amount, as shown at block 404. Values for $\Delta V$th can be determined by a resolution of the substrate bias voltage generator. For example, a substrate bias change of 1V may lead to a 100 mV value for $\Delta V$th. A step change in substrate bias voltage could be restricted to be about 100 mV leading to a value of about 10 mV for $\Delta V$th. Factors that determine $\Delta V$th include engineering implementation complexity. A step change that is too fine will lead to complex implementation, for example.

Then the supply voltage $V_{DD}$ is adjusted to maintain the same delay constant, $D_0$, as shown at block 506. For example, the critical path delay was initially set to be a function of $V_{DD}$ and $V_{th}$ such that $D(V_{DD}, V_{th})=D_0$. Then $V_{th}$ was adjusted by an amount $\Delta V_{th}$, and thus, $V_{DD}$ is subsequently adjusted by an amount $\Delta V_{DD}$ to maintain the same delay constant, such that $D(V_{DD}+\Delta V_{DD}, V_{th}+\Delta V_{th})=D_0$.

Next, the total power consumed by the circuit is sampled at block 508. Following the sampling block 508, a change in power is computed as shown at block 510, and according to the equation below:

$$\Delta P(t_0)=P(t_0)-P(t_0-\Delta t) \qquad \text{Equation (5)}$$

A change in power, $\Delta P$ is determined by comparing a current power sample with a previous power sample, as shown at blocks 512 and 514. If the current power sample is greater than the previous power sample by more than a tolerance window dp, the well bias voltage is adjusted again by an amount $-\Delta V_{th}$, as shown at block 516. Then, the supply voltage will be adjusted again, as shown at block 506, and the method returns to the compare steps.

On the other hand, if the current power sample is less than the previous power sample by more than the tolerance window dp, the well bias voltage is readjusted, as shown at block 504, and the method repeats.

If the change in power is not greater than the tolerance window dp and the change in power is not less than the tolerance window dp, then the change in power is within the tolerance window and the method moves to the hold step 518. As such, the tolerance window dp prevents adjustment of the well bias threshold voltage $V_{th}$ when a POP is reached.

Figure 6:
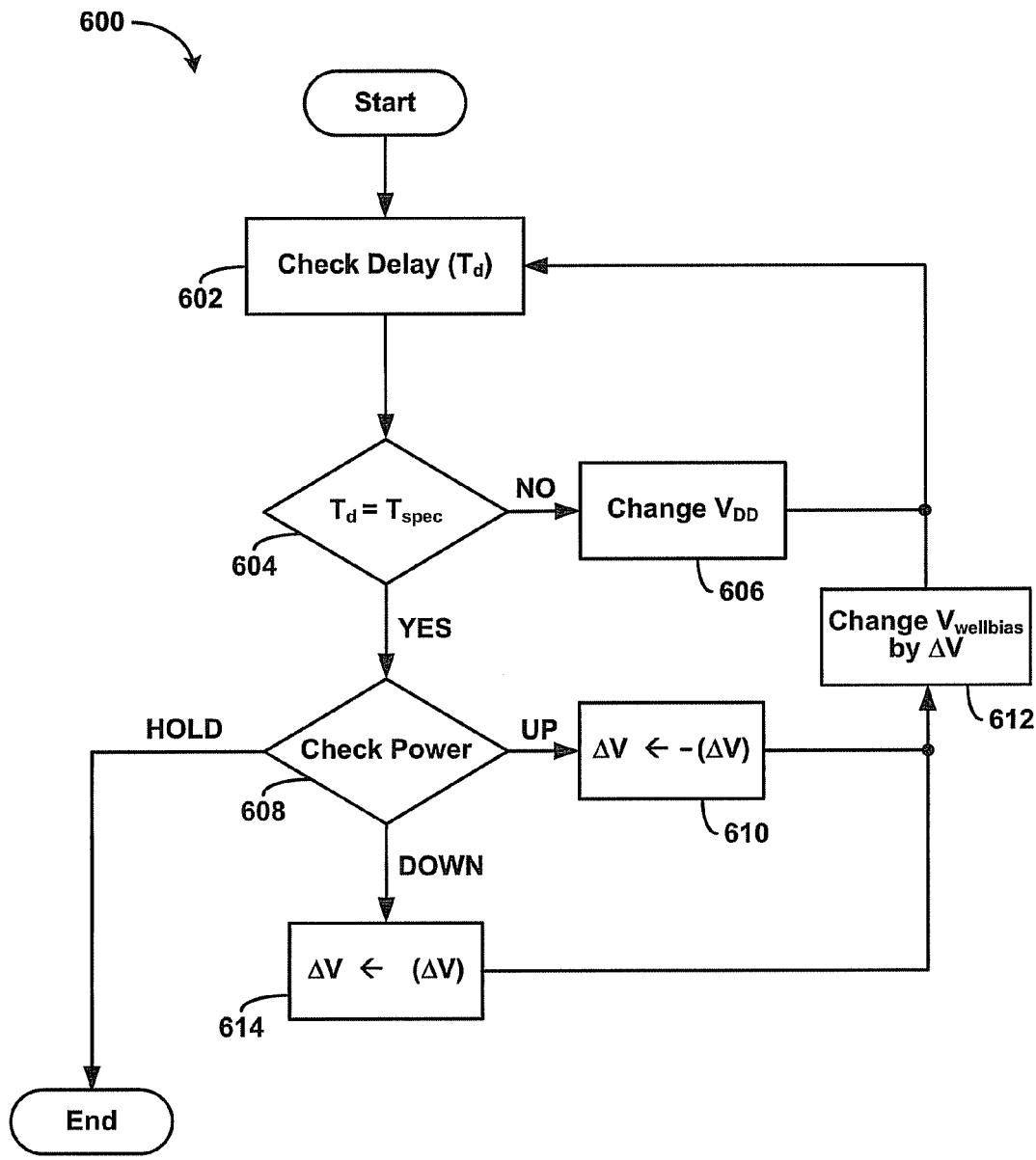
FIG. 6 is an example process flow diagram of a power optimization algorithm.

The method 500 of FIG. 5 may be performed in other manners, or taking steps out of order. As an example alternative method, FIG. 6 is a process flow diagram 600 of another example power optimization algorithm. The method 600 is initiated to arrive at a minimum energy operation of a circuit whenever a performance specification changes. In this example, the performance specification includes a specified delay, $T_{spec}$, however over performance specifications may be set as well. For example, the performance specification may include frequency ($F_{spec}=1/T_{spec}$), power, specified voltage levels, etc.

A specified delay, $T_{spec}$, can be about 10's of Mhz for micro power chips, about 400 MHz for ASICS in networking and other applications, and about 1 GHz for DSP, graphic chips, and up to 3 or more GHZ for Processors. Selection of $T_{spec}$ is determined based on a desired application.

As shown at block 602, a delay ($T_d$) of a circuit is monitor using a delay monitor. The delay of the circuit may refer to a critical path delay of the circuit, or any other specified delay of the circuit. Next, as shown at block 604, a measured delay of the circuit ($T_d$) is compared to a preset required delay ($T_{spec}$). If the delay ($T_d$) is more than the preset required delay ($T_{spec}$) and thus exceeds $T_{spec}$ by more than an acceptable tolerance limit, then a supply voltage $V_{DD}$ of the circuit is adjusted up by a single step (e.g., tolerance window size and step size may be predetermined), as shown at block 606, and the delay ($T_d$) is measured again. Similarly, if the delay ($T_d$) is less than the preset required delay ($T_{spec}$), then a supply voltage $V_{DD}$ of the circuit is adjusted down by a single step, and the delay ($T_d$) is measured again. A single step adjustment is part of the control loop for the algorithm, for example, where in each step of the algorithm a new value of $V_{dd}$ and substrate bias voltage is used. The new values differ from the previous values in small amounts, for example, 10-30 mV and can be determined by a capability of the voltage regulators providing the voltages to the chip.

If the delay of the circuit is equal to or about equal to $T_{spec}$ within the tolerance limits, e.g., a delay should be lower than $T_{spec}$ by a small margin of a few percent, then a power of the circuit is measured, as shown at block 608. For example, power consumption of the circuit is sampled and stored, and then compared with a previously stored power sample. If the current power sample is greater than the previous by a tolerance limit, a well bias voltage is adjusted by a step (e.g., step size pre-determined) in a reverse direction (e.g., if well bias was increasing previously, the well bias voltage is decreased and if the well bias was decreasing previously, the well bias voltage is increased), as shown at blocks 610 and 612. A well bias change of about 100 mV leads to a change of about 10 mV for threshold voltage. Thus, an example well bias voltage step adjustment of about 100 mV may be used.

Otherwise, if the current power sample is smaller than the previous by a tolerance limit, the well bias voltage is adjusted by a step size in the same direction as previously adjusted, as shown at block 614.

In either case, after the well bias voltage is adjusted, the delay of the circuit is checked once more. If the current power sample is equal to a previous power sample within tolerance limits, then the iteration ends and optimal values of the supply voltage $V_{DD}$ and the well bias voltage have been found.

The method 600 implements direct power measurements of the circuit and computes a difference in power between a current and a previous power sample to identify whether the operating voltages of the circuit should be readjusted to obtain optimum operating conditions.

The algorithms shown in FIGS. 5 and 6 are derived with no assumptions on the power, $P(V_{DD}, V_{th})$ and delay, $D(V_{DD}, V_{th})$, and thus, the method is independent of power or delay models of the circuit. Convergence of the algorithm requires that power and delay exhibit opposing trends as compared to $V_{DD}$ and $V_{th}$, which is typical for MOSFETs. For example, when $V_{DD}$ is increased, a delay reduces, while when $V_{th}$ increases, a delay increases.

Thus, the method performs in all or substantially all regions of operation of the circuit, for example, from sub-threshold to super-threshold. As the method relies on a difference in power measurements between the current and the last iteration, complexity of a power monitoring circuit can be reduced. For example, instead of using a conventional analog-digital converter (ADC) as a power monitoring circuit, a simpler circuit to directly compare values in the last two iterations can be implemented. Using a conventional ADC power monitor can be inefficient because converting the analog power signal to a digital power signal for the purposes of this application requires the ADC to have a high enough resolution to accommodate the tolerance window dp while covering the full range of power values.

Figure 7:
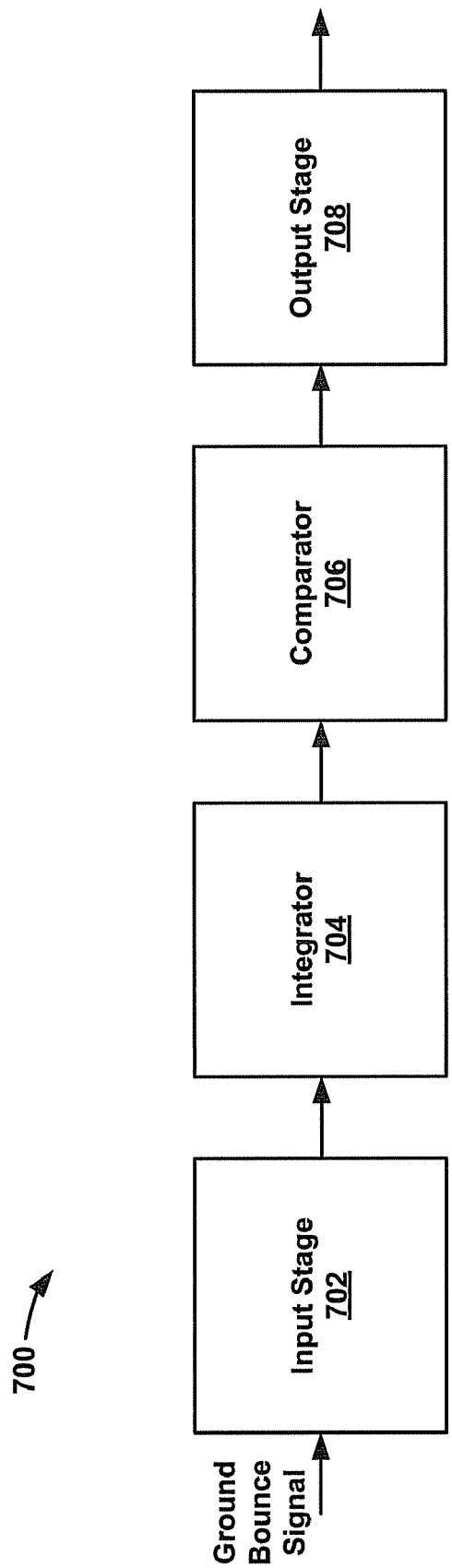
FIG. 7 is a schematic representation of an example power monitor block.

FIG. 7 is a block diagram showing an example power monitor 700. The power monitor 700 includes an input stage 702, an integrator 704, a comparator 706, and an output stage 708. The power monitor 700 can make direct measurements of power of a circuit by observing a ground bounce signal at virtual ground, for example. A current through a ground resistor (e.g., formed by the sleep transistor switch 202 shown in FIG. 2) forms a voltage drop across the resistor. Thus, measuring an average voltage drop across the resistor leads to a measurement of average power.

A ground bounce signal is associated with transistor switching where a gate voltage of a transistor appears less than the virtual ground due to large current flows during switching. For example, when a gate is turned on, if enough current flows through the emitter-collector circuit so that silicon in an immediate vicinity of the emitter is pulled to a logic high, local ground as perceived by the transistor is raised to a value above true ground. Relative to the local ground, the base voltage can become negative, which shuts off the transistor. As excess local charge dissipates (and a local ground returns to a value about equal to true ground), the transistor turns back on, possibly causing a repeat of the operation of turning the transistor on/off, which gives the name, ground bounce.

As such, a ground bounce signal can have large and rapid transients due to switching activity in a load circuit. The power monitor 700 measures average values of the ground bounce over a specified interval. A specified interval may be determined by a time required by the supply regulators to settle to a new voltage value as dictated by a previous step of the control algorithm. The time step may be governed by a response time of the regulators and may be on the order of 100's of microseconds, for example.

The input stage 702 is coupled to a load circuit and receives ground bounce signals from the load circuit. A change in the average value between two consecutive iterations of a ground bounce signal can be small, on the order of a few millivolts, for example, while a nominal value can be as large as 100 mV. Since the operating frequency and hence the power consumption can change by orders of magnitude in a DVTS implementation, the average value of the ground bounce over a specified interval can also change by large amounts, which may necessitate a large dynamic operating range for the power monitor 700. To enable a large range for the power monitor, the input stage 702 can be coupled to the integrator 704, which operates as a signal conditioning circuit that includes a low-pass filter followed by an amplifier that can be tuned over a few orders of magnitude.

A gain, $GI_{nt}$, of the integrator 704 may be determined according to Equation (6):

$$GI_{nt} = \frac{N}{f_{sys} \cdot RC} \quad \text{Equation (6)}$$

where N is an integration time of cycles of a system clock that has frequency $f_{sys}$, and RC is an integrator time constant. An average current drawn by the load circuit can be written as:

$$I_{total} = a \cdot C_L \cdot V_{DD} \cdot f_{sys} + I_{leak} \quad \text{Equation (7)}$$

where a is an activity factor of the circuit, $C_L$ is a total switching capacitance of the load circuit and $I_{leak}$ is a leakage current of the load circuit. The activity factor defines a number of transitions that a signal makes during one half of a clock cycle. For example, activity factor is a ratio of a number of logic transitions to a number of clock cycles over which the observation is made. Activity factor values are usually about 0.15 for a typical data net, but are application dependent and is about 1 for a clock net, for example. Leakage current of the circuit is independent of while the activity factor a is proportional to $f_{sys}$. If resistance from virtual ground to supply ground is $R_{gnd}$, then an average ground bounce signal can be approximated as:

$$V_{gbounce} = R_{gnd} \cdot I_{total} = a \cdot C_L R_{gnd} \cdot V_{DD} \cdot f_{sys} + I_{leak} \cdot R_{gnd} \quad \text{Equation (8)}$$

The output of the integrator can be written as:

$$V_{Int} = V_{gbounce} \cdot GI_{nt} = N/RC\{a \cdot C_L R_{gnd} \cdot V_{DD} + I_{leak} \cdot R_{gnd}/f_{sys}\} \quad \text{Equation (9)}$$

Since the leakage current $I_{leak}$ is smaller than an active current in the load circuit, an output of the integrator after an integration period of $N/f_{sys}$ may have little dependence on the system frequency $f_{sys}$ (e.g., the $I_{leak}$ term in Equation (9) can be considered nominal or zero in view of the active current). Thus, sensitivity of measurements of a power difference can be maintained near constant over large dynamic ranges of input ground bounce signals.

Thus, the integrator 704 filters the ground bounce signal and amplifies the ground bounce signal. The integrator 704 helps to find an average value of the input signal. The average value is given by an integral over time divided by a length of the time interval. An average value is used because an instantaneous signal may include too much noise, for example.

An output of the integrator stage 704 is received by the comparator 706, which compares the output with an output that was previously received. A difference of the two outputs can be calculated, and sent to the output stage 708, which may quantize the difference into two bits. Thus, the power monitor 700 samples and holds ground bounce signals to perform a comparison between two samples and further quantizes the differences into 2 bits for output, for example.

Figure 8:
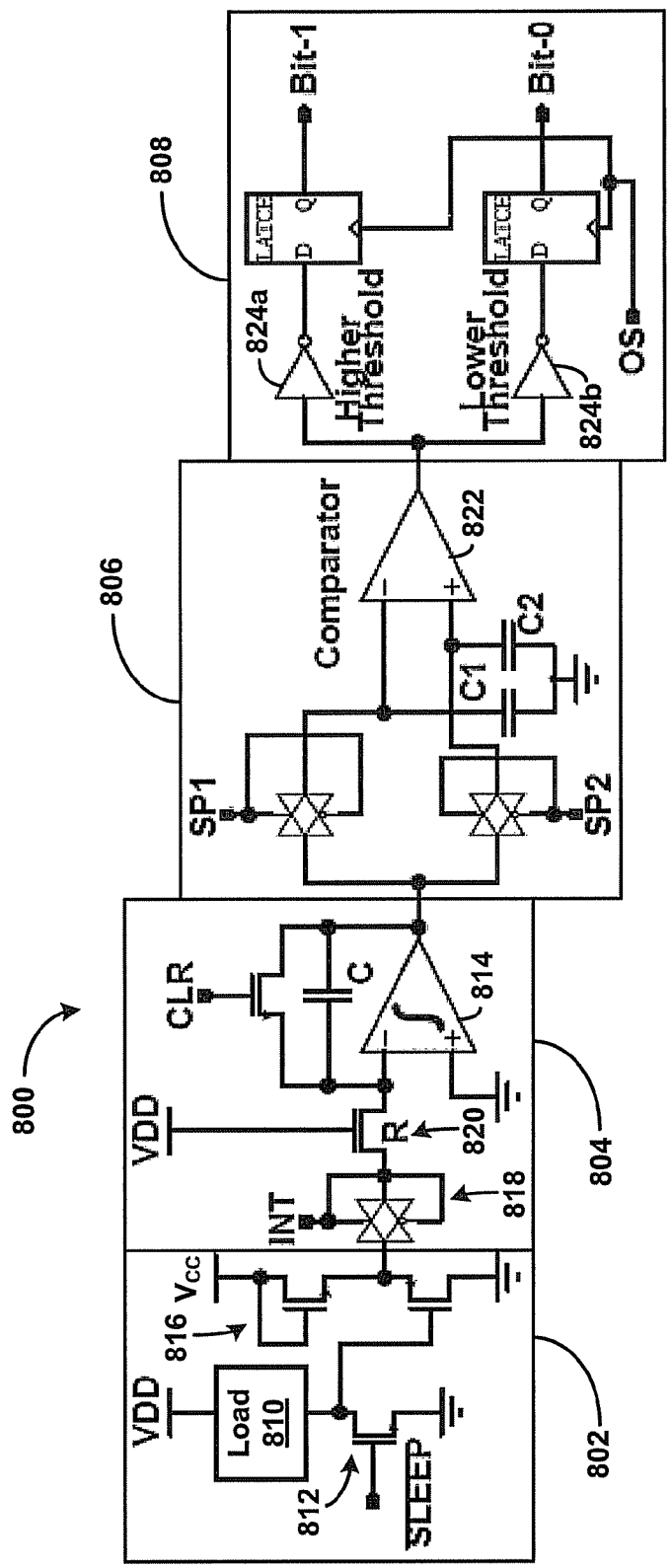
FIG. 8 is an example schematic representation of a power monitor circuit.

FIG. 8 is an example schematic representation of a power monitor circuit 800. The power monitor circuit 800 includes an input stage 802, an integrator 804, a comparator 806, and an output stage 808.

In the input stage 802, a ground bounce signal to be measured is received from a load circuit 810 and is level shifted by a PMOS level shifter transistor 812 to match common mode requirements of an integrator op-amp 814 in the integrator 804. The op-amp 814 may not have stringent constraints on a unity gain frequency, and thus, a single stage differential amplifier 816 with low quiescent bias current may provide sufficient amplification. For example, since speeds of the measurements are governed by speeds of off-chip voltage regulators (which can be slow), the single stage differential amplifier 816 can also be made slow and hence low currents may suffice.

The integrator stage 804 is initiated by enabling an integrator input switch 818. An RC response for the op-amp 814 in the integrator 804 needs to be long enough to allow averaging over large durations. A resistor 820 in the integrator 804 is implemented using an NMOS transistor in a triode region, with a gate coupled to $V_{DD}$. Changes in $V_{DD}$ will change a resistance of the resistor 820 and effectively multiply $V_{DD}$ to the ground bounce measurement. The product of the voltage $V_{DD}$ and the ground bounce is the power consumption of the load circuit 810.

An output of the integrator 804 is sampled onto a capacitor C2 in the comparator 806, and subtracted from a previous sample that is stored on capacitor C2 in the comparator 806 by a comparator op-amp 822. Since a difference of two samples is taken, the power monitor 800 is substantially immune to any correlated noise. An output of the comparator op-amp 822 is quantized into two bits by a pair of skewed inverters 824*a-b* in the output stage 808. The inverters 824*a-b* may have different trip points, which are input voltages at which an output of comparators switch, to implement a tolerance window dp for the DVTS algorithm. The voltage level corresponds to the measured average power. Since power measurements are made with an accuracy of a tolerance window, dp, the tolerance window can be represented as a small voltage differential in the comparator. Any voltage change (representing power difference between the last two measurements) that falls within the window can be ignored, and only larger changes are used by the algorithm.

The power monitor circuit 800 accomplishes low pass filtering of the ground bounce signal by integration and also provides amplification with integration-duration-dependent gain. The power monitor 800 samples and holds to perform comparison between two samples and further quantizes the differences into 2 bits for output. The power monitor 800 requires a lower capacitance capacitor (i.e., 500 femtoFarads in 65 nm node) that can be on-chip and is independent of the size of a load circuit for which power consumption is optimized. For example, measurement accuracy can be controlled for different load currents by adjusting integration time, and other parameters of the circuit such as capacitances can be done once and reused for different load currents (and hence different load circuits). Further, the power monitor 800 measures power of the load circuit 810 directly.

Figure 9:
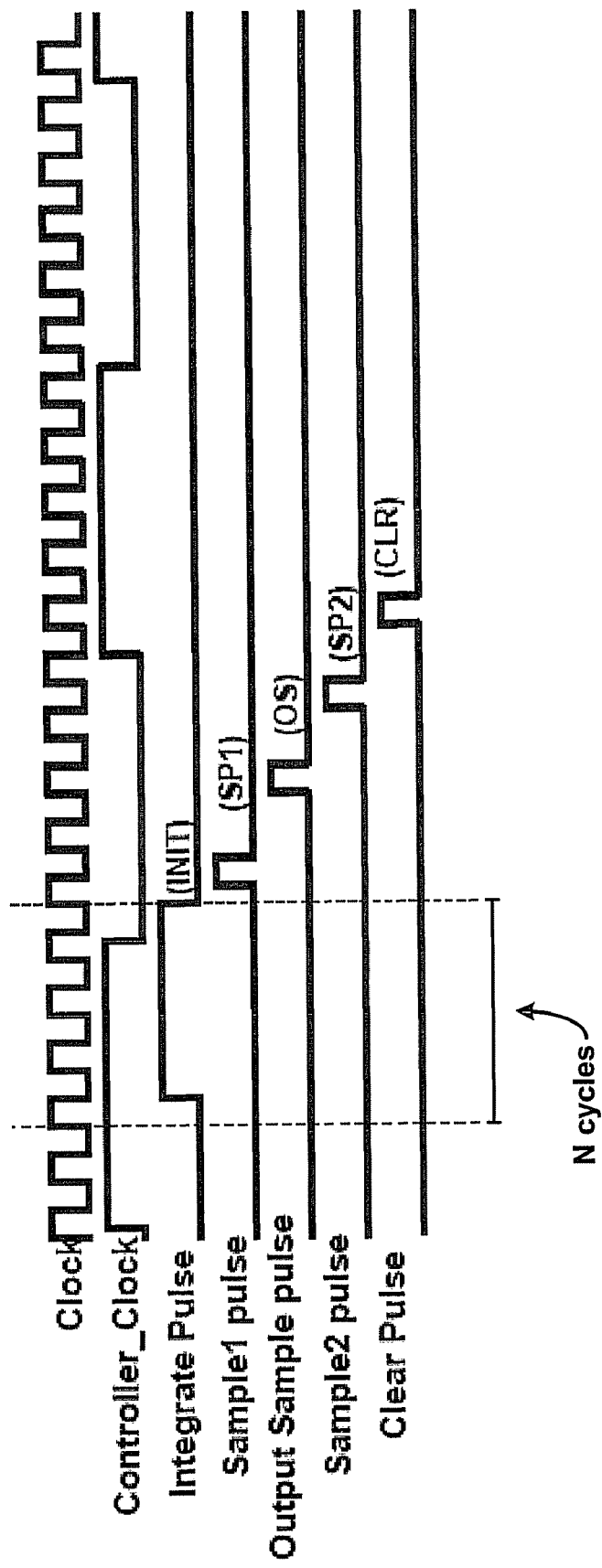
FIG. 9 is a graphical representation of an example designed operational timing diagram of an example power monitor block.

FIG. 9 is a graphical representation of an example operational timing diagram of the power monitor circuit 800. The operational timing diagram tracks signals relative to a system clock, a controller clock, an integrate pulse, a first sample pulse, an output sample pulse, a second sample pulse, and a clear pulse. Measurements of the signals are initiated by enabling the integrator input switch 818. Signals received at the input switch 818 are represented by the integrate pulse, which when set to a logic high, enable the input switch 818. An integrator capacitor C1, previously discharged, integrates for a duration of N cycles of the system clock. At the end of the integration duration, the integrator input switch 818 is reset and the integrate pulse is set to low.

An output of the integrator 804 is sampled onto the capacitor C1 when the sample1 pulse is set to high, followed by setting the output sample pulse to high, thereby latching the bit readings of the pair of skewed inverters 824a-b. The sample2 pulse is then set to high, and the integrator output is sampled onto the capacitor C2. This stores the current power reading to be used for a next comparison. The clear pulse is set to high at the end of the operation to discharge the integrator capacitor C1.

An impact of charge leakage from the sampling capacitors C1 and C2 is minimized by enabling frequent power measurements until the optimum power consumption is reached. When altering body bias voltages, a single step of change occurs so that in a subsequent $V_{DD}$ alteration phase, not more than a step change in $V_{DD}$ would be required, for example.

Figure 10:
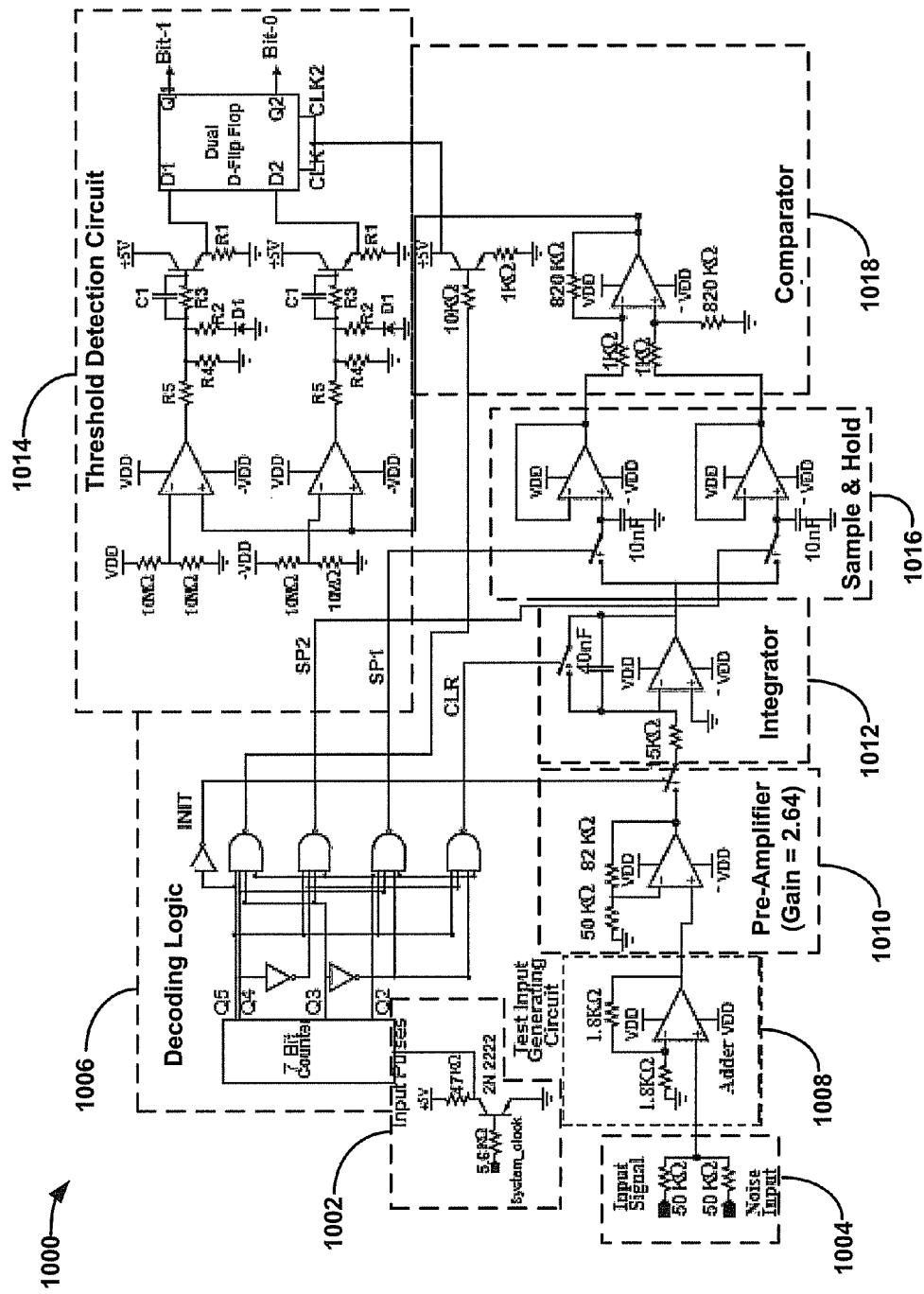
FIG. 10 is a schematic representation of an example power monitor circuit.

FIG. 10 is a schematic representation of another example power monitor circuit 1000. The power monitor circuit 1000 includes system clock 1002, input signals 1004, decoding logic 1006, an adder 1008, a pre-amplifier 1010, an integrator 1012, a threshold detection circuit 1014, a sample and hold circuit 1016, and a comparator 1018.

The power monitor circuit 1000 includes simulated input signals 1004 to illustrate operation of the circuit 1000. The input signals 1004 include a slowly varying input signal and a fast switching noise signal. The input signals 1004 may represent a received ground bounce signal from a load circuit, which is being optimized for power consumption.

The input signals 1004 are input to the adder 1008, which simulates a ground bounce signal by adding the fast switching signal with the slowly varying signal. The slowly varying signal has an AC component and a DC offset that represents an average of a ground bounce signal. The adder 1008 outputs the processed input signals that now simulate a ground bounce signal to the pre-amplifier 1010. The pre-amplifier amplifies the simulated ground bounce signal, and outputs the amplified signal to the integrator 1012 for low pass filtering of the ground bounce signal. The output of the integrator 1012 is then received by the sample and hold circuit 1016, where a previous output of the integrator 1012 and a present output of the integrator 1012 are sampled and held. The previous and current outputs of the sample and hold circuit 1016 are then received by the comparator circuit 1018, where the two outputs are compared. A difference, $\Delta P$, between the previous and current outputs is received by the threshold detection circuit 1014 to determine how the difference of the two integrator outputs relate to a tolerance window dp. The threshold detection circuit 1014 outputs 2 bits indicating whether $\Delta P < -dp$, $\Delta P > dp$, or $-dp < \Delta P < dp$.

The system clock 1002 and the decoding logic 1006 provide timing signals for sequential operation at the various stages in the signal processing of the input signals 1004.

Op-amps in the power monitor circuit 1000 may be 741-type op-amps with no offset compensations. A gain of the pre-amplifier 1010 can be set to be about 3, while the RC response of the integrator 1012 may be about 600 μs. The comparator 1018 is designed for a high gain of about 800, for example.

The power monitor circuit 1000 was tested with a power supply voltage of ±12V, and the simulated ground bounce signal that had a noise signal simulated by adding a spike obtained by filtering a square wave signal with a passive RC high pass filter. Functionality of the power monitor circuit 1000 was verified by slowly varying the ground offset by a low frequency 5 Hz sinusoidal signal.

Figure 11:
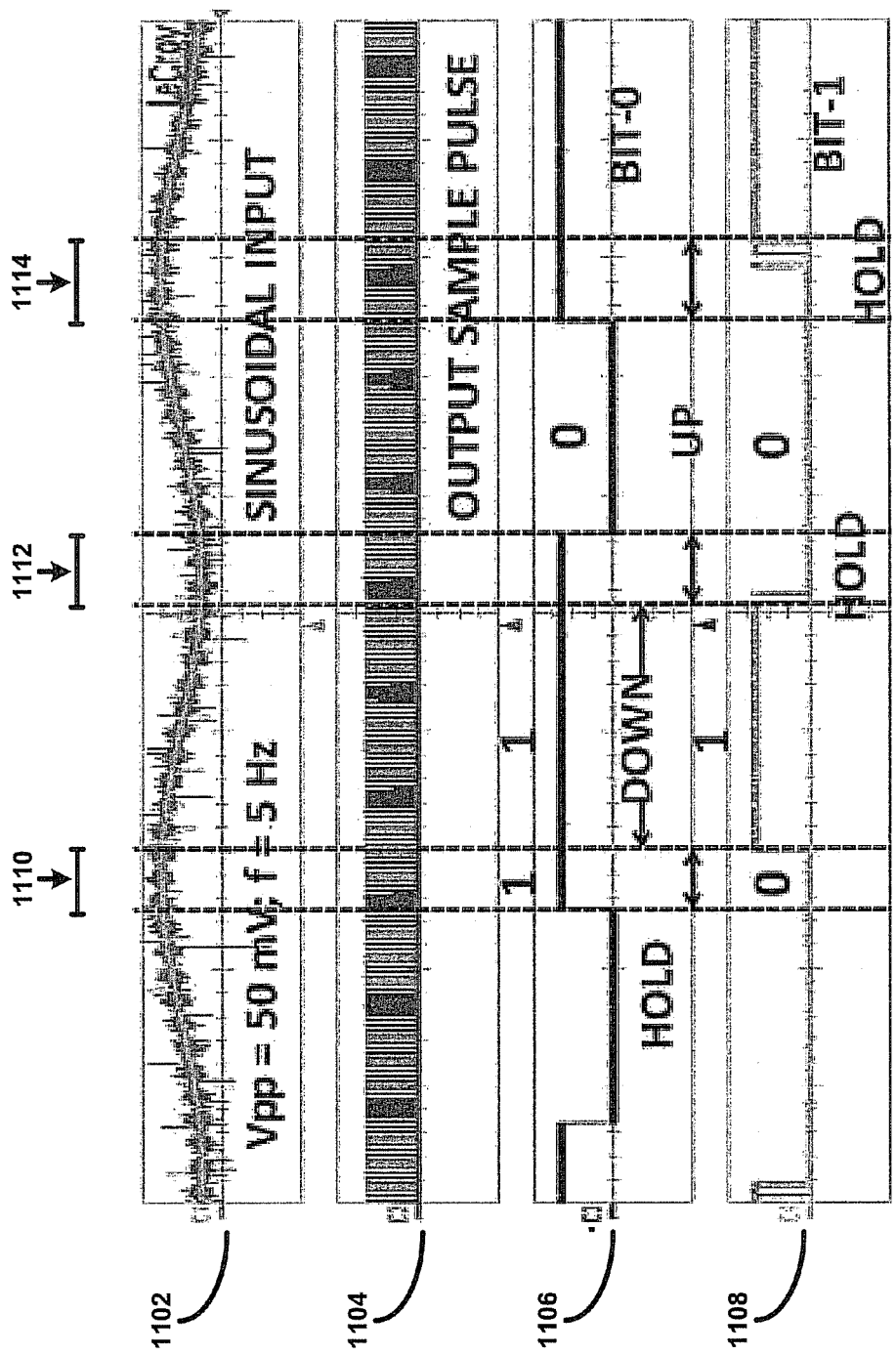
FIG. 11 is a graphical representation of example operational waveforms of an example power monitor circuit.

FIG. 11 is a graphical representation of example operational waveforms of the power monitor circuit 1000, as observed on an oscilloscope, for example. The operational waveforms include a noisy sinusoidal signal input 1102, sample pulses 1104 output from the circuit 1000, a first bit trace 1106, and a second bit trace 1108. The bit traces 1106 and 1108 are the 2 bit output waveforms of the threshold detection circuit 1014.

A varying ground offset signal produces a low first bit trace 1106 and a low second bit trace 1108, resulting in a 00 bit pair when a sinusoidal input signal input 1102 is rising. On the other hand, the varying ground offset signal produces a high first bit trace 1106 and a high second bit trace 1108 resulting in a 11 bit pair when the sinusoidal input signal input 1102 is dropping. Near slow varying peaks where a slope is near zero, the bit output is 01 indicating the hold states at time frames 1110, 1112, and 1114. A smallest change in an average ground bounce that produces 00 or 11 bit pairs at the output can be defined as a resolution of the power monitor. To increase a resolution of the power monitor, the integration time can be increased, or the tolerance window can be reduced, for example.

Figure 12:
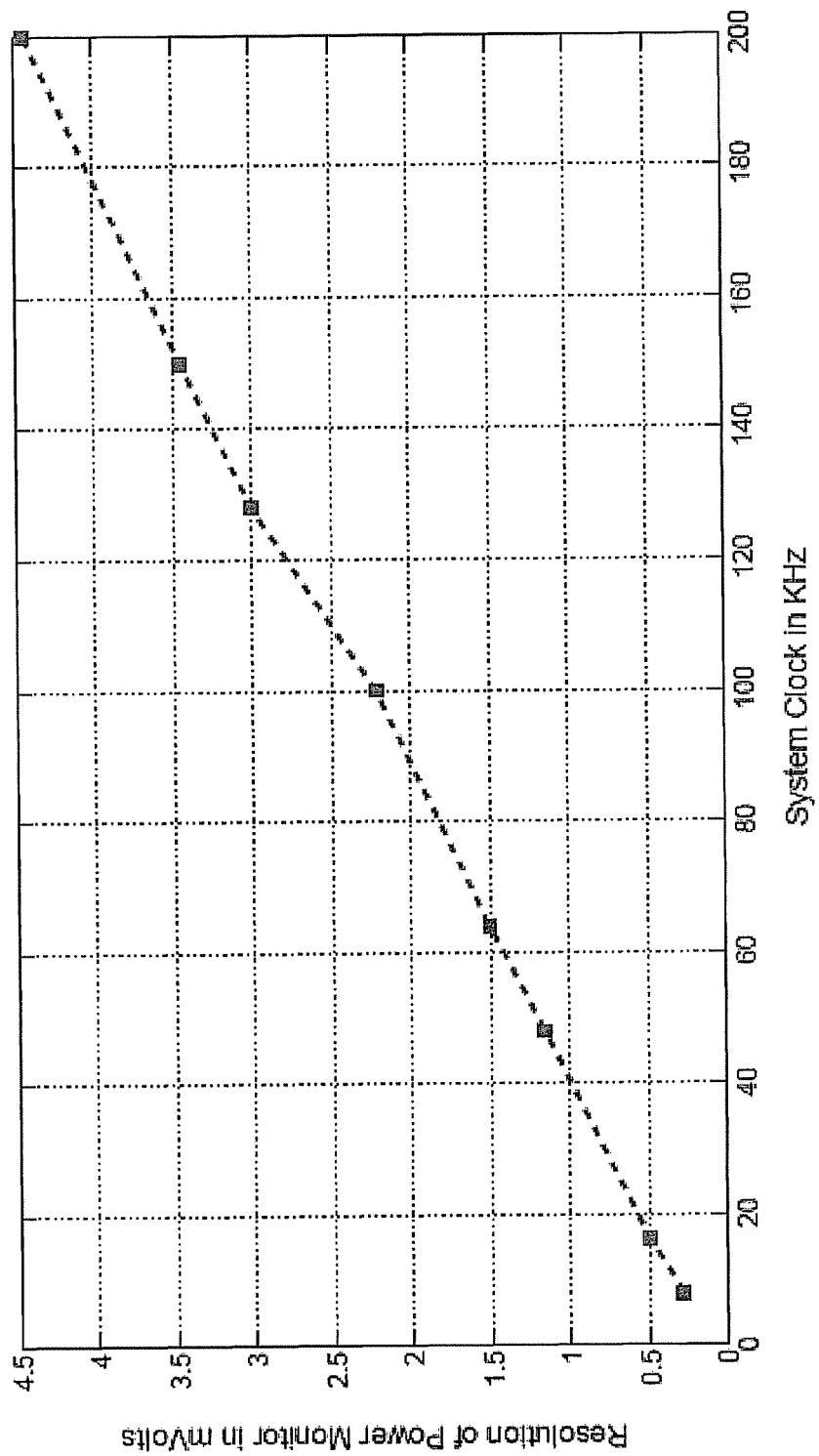
FIG. 12 is a graphical representation of an example relationship between a resolution of an example power monitor and frequency.

FIG. 12 is a graphical representation of an example relationship between resolution of the power monitor 1000 and frequency of integration. With varying current levels in an actual load circuit, the voltage drop across a sleep transistor switch will also vary. The voltage across the sleep transistor switch is monitored by the power monitor, and the power monitor needs to be able to maintain a sensitivity to detect the changes across a range of sleep transistor switch voltages. The resolution to frequency plot in FIG. 12 illustrates that the power monitor sensitivity is fairly constant across varying common mode levels of the virtual ground. For example, with varying current levels in the actual circuit, the voltage drop across the sleep transistor will also vary. Since this voltage is being monitored by the power monitor that detects changes in this voltage, the power monitor needs to be able to maintain sensitivity to detect changes across range of voltage values.

But larger integration durations and/or larger ground bounces may cause the integrator 812 to saturate and may worsen sensitivity. A resolution observed from the plot is 277 µV at 100 mV offset signal for integration period of 2 ms. This is at a sampling clock frequency of 8 KHz, equivalent to a 125 uS period. As such, the integration time of 2 ms is 16 times the sampling clock period. Reference is made to the left bottom data point in the graph of FIG. 10 with a sampling clock frequency of 8 KHz (125 uS period). The integration time is 16 times the sampling clock period (125 uS×16=2 mS).

Figure 13A:
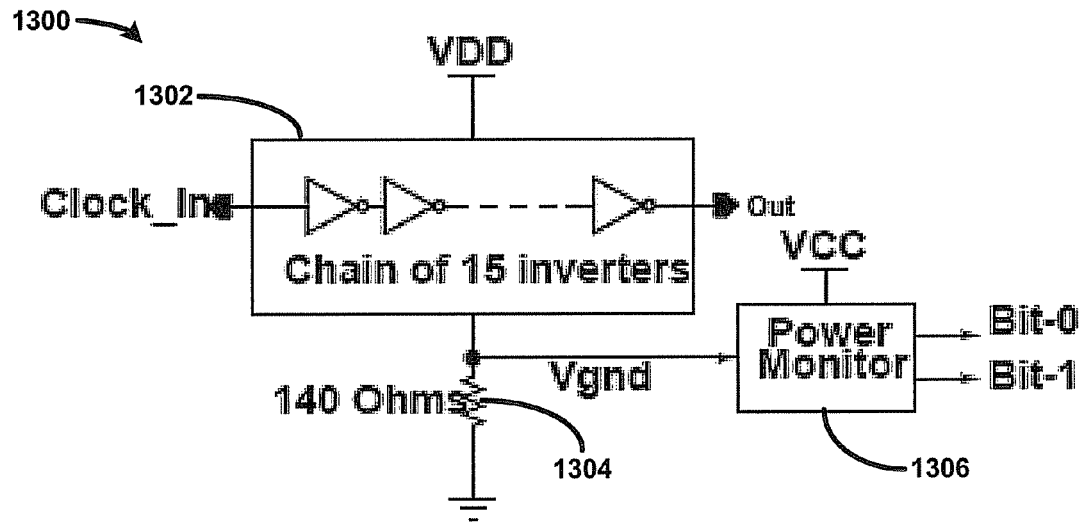
FIG. 13A is a schematic representation of an example power monitor test circuit.

FIG. 13A is a schematic representation of an example of power monitor test circuit 1300. The power monitor test circuit 1300 includes a chain of 15 inverters 1302 coupled through a resistor 1304 to a power monitor 1306. The grounds of the 15 inverters 1302 and an input to the power monitor 1306 share a common node and are coupled with the power supply ground by the resistor 1304, which may have a resistance of 1405Ω, for example. The $V_{DD}$ of the chain of 15 inverters 1302 is changed slowly while the inverters are excited by a 50 kHz square wave.

Figure 13B:
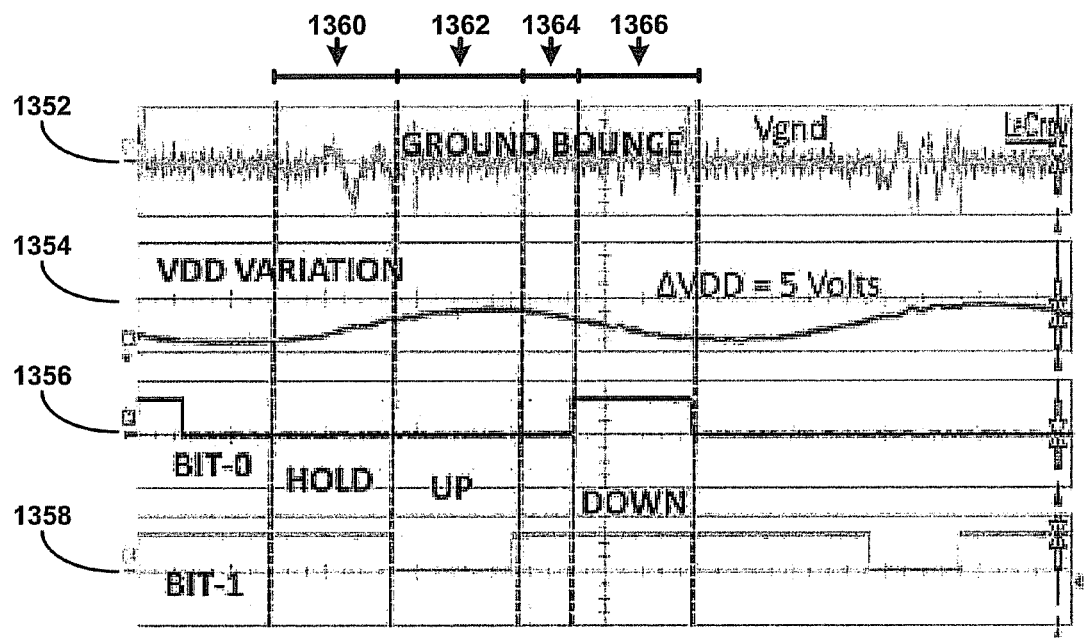
FIG. 13B is a graphical representation of example operational waveforms of an example power monitor test circuit.

FIG. 13B is a graphical representation of example operational waveforms of the power monitor test circuit 1300. The operational waveforms include a ground bounce signal 1352, a $V_{DD}$ variation signal 1354, a first bit trace 1356, and a second bit trace 1358. A rising $V_{DD}$ leads to increasing power consumption of the circuit 1300, and resulting in a 00 bit pair at the time frame 1362. Accordingly, a dropping $V_{DD}$ results in a 11 bit pair shown at the time frame 1366, and for $V_{DD}$ near the peaks, the resulting bit pair is 01, indicating the hold states at the time frames 1360 and 1364.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

It should be further understood that this and other arrangements described herein are for purposes of example only. As such, those skilled in the art will appreciate that other arrangements and other elements (e.g. machines, interfaces, functions, orders, and groupings of functions, etc.) can be used instead, and some elements may be omitted altogether according to the desired results. Further, many of the elements that are described are functional entities that may be implemented as discrete or distributed components or in conjunction with other components, in any suitable combination and location.

What is claimed is:

1. A method for optimizing power consumption of a circuit, comprising:
   determining a propagation delay of a signal through a portion of the circuit;
   if the propagation delay does not meet a specified delay requirement, then adjusting a supply voltage of the circuit until the propagation delay of the circuit meets the specified delay requirement;
   determining a difference between a power consumption level of the circuit and a previous power consumption level of the circuit;
   comparing the difference with a specified amount to determine if the difference is within a tolerance window; and
   when the difference is determined to be outside the tolerance window, adjusting a threshold voltage of the circuit such that the power consumption level is within the tolerance window.

2. The method of claim 1, further comprising determining the power consumption of the circuit and adjusting the threshold voltage and the supply voltage of the circuit until the propagation delay of the circuit meets the specified delay requirement.

3. The method of claim 1, further comprising after adjusting the threshold voltage, determining whether the propagation delay meets the specified delay requirement, and if not, determining the power consumption level of the circuit and adjusting either the threshold voltage or the supply voltage of the circuit until the propagation delay of the circuit meets the specified delay requirement.

4. The method of claim 1, further comprising after adjusting the threshold voltage, determining the power consumption level of the circuit and adjusting either the threshold voltage or the supply voltage of the circuit until the power consumption level of the circuit meets a specified power requirement.

5. The method of claim 1, wherein the specified delay requirement is a range of time.

6. The method of claim 1, wherein adjusting the threshold voltage of the circuit comprises adjusting the threshold voltage by a pre-determined amount.

7. The method of claim 1, wherein if the difference is greater than the specified amount, decreasing the threshold voltage of the circuit.

8. The method of claim 1, wherein if the difference is less than the specified amount, increasing the threshold voltage of the circuit.

9. A method for optimizing power consumption of a circuit, comprising:
   setting a supply voltage and a threshold voltage of the circuit to result in a specified propagation delay of a signal through a portion of the circuit;
   determining a first power consumption of the circuit at a first time;
   determining a second power consumption of the circuit at a second time;
   determining a difference between the first power consumption and the second power consumption;
   comparing the difference to a specified power requirement; and
   if the difference does not meet the specified power requirement, adjusting the threshold voltage of the circuit.

10. The method of claim 9, wherein adjusting the threshold voltage of the circuit comprises lowering a value of the threshold circuit.

11. The method of claim 9, further comprising:
    determining a propagation delay of a signal through a portion of the circuit; and
    if the propagation delay does not meet the specified delay requirement, then adjusting a supply voltage of the circuit until the propagation delay of the circuit meets the specified delay requirement.

12. The method of claim 9, wherein if the difference between the first power consumption and the second power consumption does not meet the specified power requirement, adjusting the threshold voltage comprises lowering a value of the threshold voltage.

13. The method of claim 9, further comprising continuing to adjust the threshold voltage and the supply voltage until the difference between the first power consumption and the second power consumption of the circuit meets the specified power requirement.

14. The method of claim 9, wherein if the difference is greater than the specified power requirement, decreasing the threshold voltage.

15. The method of claim 9, wherein if the difference is less than the specified power requirement, increasing the threshold voltage comprises adjusting the threshold voltage in a positive manner as compared to a previous adjustment of the threshold voltage.

16. A power optimization circuit for optimizing power consumption of a circuit, comprising:
    a power monitor configured to determine a power consumption level of the circuit;
    a delay monitor configured to determine a propagation delay of a signal through a portion of the circuit; and
    a controller coupled to the power monitor and the delay monitor, the controller configured to determine if the propagation delay meets a specified delay requirement and if not, adjusting either a supply voltage or a threshold voltage of the circuit until the propagation delay meets the specified delay requirement, the controller further configured to determine a difference between the power consumption level of the circuit and a previous power consumption level of the circuit, compare the difference to a specified amount to determine if the difference is within a tolerance window, and when the difference is determined to be outside the tolerance window, readjust either the supply voltage or the threshold voltage of the circuit such that the power consumption level is within the tolerance window.

17. The power optimization circuit of claim 16, wherein the controller is further configured to readjust either the supply voltage or the threshold voltage of the circuit to enable the circuit to meet the specified power consumption requirement and the specified delay requirement.

18. The power optimization circuit of claim 16, wherein the controller is configured to adjust either the supply voltage or the threshold voltage of the circuit by lowering either the supply voltage or the threshold voltage of the circuit.

19. The power optimization circuit of claim 16, wherein the delay monitor includes a critical path mimic circuit that represents a critical path that is present in the circuit, the critical path being considered about a longest path between any two nodes in the circuit through which a signal propagates.

20. The power optimization circuit of claim 19, wherein the delay monitor is configured to determine a propagation delay of a signal through the critical path mimic circuit.

21. The power optimization circuit of claim 16, wherein the controller is configured to minimize power consumption of the circuit while maintaining the propagation delay within the specified delay requirement.

22. The power optimization circuit of claim 16, wherein the power monitor is configured to determine a change in power consumed by the circuit by comparing a present power consumption level of the circuit with a previous power consumption level of the circuit.

23. The power optimization circuit of claim 22, wherein the controller is configured to adjust the threshold voltage when the change in power consumed by the circuit does not meet the specified power requirement.

24. The power optimization circuit of claim 16, wherein the controller is configured to adjust the threshold voltage in a negative manner as compared to a previous adjustment of the threshold voltage when the present power consumption level is greater than the previous power consumption level by more than the specified amount.

25. The power optimization circuit of claim 16, wherein the controller is configured to adjust the threshold voltage in a positive manner as compared to the previous adjustment of the threshold voltage when the present power consumption level is less than the previous power consumption level by more than the specified amount.

26. The power optimization circuit of claim 16, wherein the power monitor is configured to measure power of the circuit by observing a ground bounce signal.

* * * * *

UNITED STATES PATENT AND TRADEMARK OFFICE
CERTIFICATE OF CORRECTION

PATENT NO. : 7,973,594 B2
APPLICATION NO. : 12/551010
DATED : July 5, 2011
INVENTOR(S) : Amrutur et al.

It is certified that error appears in the above-identified patent and that said Letters Patent is hereby corrected as shown below:

On the Title Page, in Field (75), under "Inventors", in Column 1, Line 2, delete "Guruaj" and insert -- Gururaj --, therefor.

On the Title Page, in Column 1, in the drawing, delete " $\overline{SLEEP}$ " and insert -- $\overline{SLEEP}$ --, therefor.

On the Title Page, in Field (56), under "OTHER PUBLICATIONS", in Column 2, Line 9, delete "Vdd and Vth" and insert -- $V_{dd}$ and $V_{th}$ --, therefor.

On the Title Page, in Column 2, in the drawing, for Tag "502", in Line 1, delete "VDD for D(VDD,Vth) = D0" and insert -- $V_{DD}$ for $D(V_{DD}, V_{th}) = D_0$ --, therefor.

On the Title Page, in Column 2, in the drawing, for Tag "504", in Line 1, delete "Vth by ΔVth" and insert -- $V_{th}$ by $\Delta V_{th}$ --, therefor.

On the Title Page, in Column 2, in the drawing, for Tag "506", in Lines 1-2, delete "Adjust VDD to maintain D(VDD+ΔVDD, Vth+ΔVth)=D0" and insert -- Adjust $V_{DD}$ to maintain $D(V_{DD}+\Delta V_{DD}, V_{th}+\Delta V_{th})=D_0$ --, therefor.

On the Title Page, in Column 2, in the drawing, for Tag "516", in Line 2, delete "-ΔVth" and insert -- $-\Delta V_{th}$ --, therefor.

On Title Page 2, in Field (56), under "OTHER PUBLICATIONS", in Column 1, Line 1, delete "Paralle l/O" and insert -- Parallel I/O --, therefor.

On Title Page 2, in Field (56), under "OTHER PUBLICATIONS", in Column 2, Line 7, delete "Comsumption" and insert -- Consumption --, therefor.

In Fig. 1, Sheet 1 of 13, for Tag "102", in Line 3, delete "(VDD,VTH)" and

Signed and Sealed this
Nineteenth Day of June, 2012

David J. Kappos
*Director of the United States Patent and Trademark Office* insert -- ($V_{DD}, V_{TH}$) --, therefor.

In Fig. 1, Sheet 1 of 13, for Tag "104", in Line 1, delete "D(VDD, VTH)" and insert -- D($V_{DD}$, $V_{TH}$) --, therefor.

In Fig. 1, Sheet 1 of 13, for Tag "106", in Line 1, delete "P(VDD, VTH)" and insert -- P($V_{DD}$, $V_{TH}$) --, therefor.

In Fig. 1, Sheet 1 of 13, for Tag "110", in Lines 2-4, delete "D(VDD, VTH) = D0 & min(P(VDD, VTH))" and insert -- D($V_{DD}$, $V_{TH}$) = $D_0$ & min(P($V_{DD}$, $V_{TH}$)) --, therefor.

In Fig. 1, Sheet 1 of 13, for Tag "108", in Line 4, delete "(D0)" and insert -- ($D_0$) --, therefor.

In Fig. 2, Sheet 2 of 13, delete "$\overline{SLEEP}$" and insert -- $\overline{SLEEP}$ --, therefor.

In Fig. 5, Sheet 5 of 13, for Tag "502", in Line 1, delete "VDD for D(VDD,Vth) = D0" and insert -- $V_{DD}$ for D($V_{DD}$,$V_{th}$) = $D_0$ --, therefor.

In Fig. 5, Sheet 5 of 13, for Tag "504", in Line 1, delete "Vth by ΔVth" and insert -- $V_{th}$ by $\Delta V_{th}$ --, therefor.

In Fig. 5, Sheet 5 of 13, for Tag "506", in Lines 1-2, delete "Adjust VDD to maintain D(VDD+ΔVDD, Vth+ΔVth)=D0" and insert -- Adjust $V_{DD}$ to maintain D($V_{DD}$+$\Delta V_{DD}$, $V_{th}$+$\Delta V_{th}$)=$D_0$ --, therefor.

In Fig. 5, Sheet 5 of 13, for Tag "516", in Line 2, delete "-ΔVth" and insert -- -$\Delta V_{th}$, --, therefor.

In Fig. 8, Sheet 8 of 13, for Tag "802", delete "VDD" and insert -- $V_{DD}$ --, therefor.

In Fig. 8, Sheet 8 of 13, for Tag "802", delete "$\overline{SLEEP}$" and insert -- $\overline{SLEEP}$ --, therefor.

In Fig. 8, Sheet 8 of 13, for Tag "804", delete "VDD" and insert -- $V_{DD}$ --, therefor.

In Fig. 8, Sheet 8 of 13, for Tag "808" delete "  " and insert --  --, therefor.

In Fig. 8, Sheet 8 of 13, for Tag "808", delete " 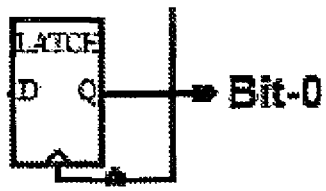 " and
insert -- 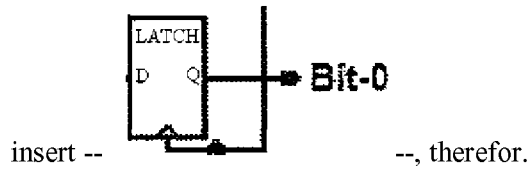 --, therefor.
In Fig. 10, Sheet 10 of 13, for Tag "1014", delete " 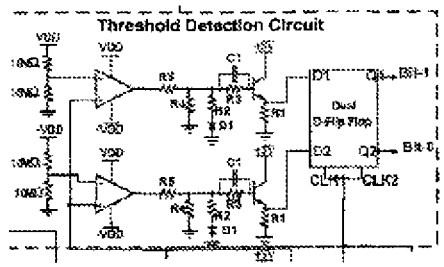 " and
insert -- 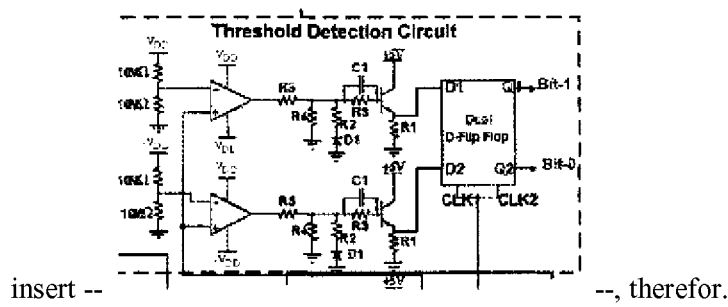 --, therefor.
In Fig. 10, Sheet 10 of 13, for Tag "1008", delete " 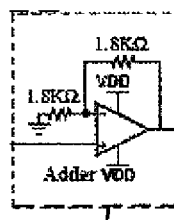 " and
insert -- 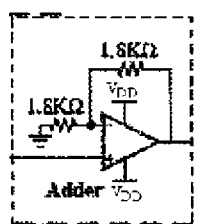 --, therefor.

CERTIFICATE OF CORRECTION (continued)  
U.S. Pat. No. 7,973,594 B2

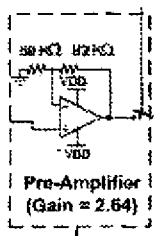

In Fig. 10, Sheet 10 of 13, for Tag "1010", delete " " and

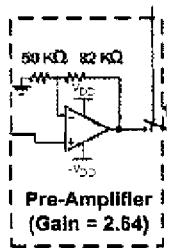

insert -- --, therefor.

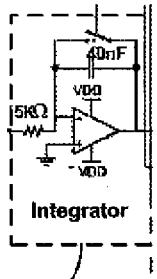

In Fig. 10, Sheet 10 of 13, for Tag "1012", delete " " and

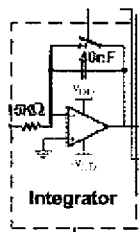

insert -- --, therefor.

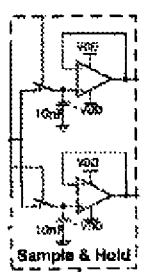 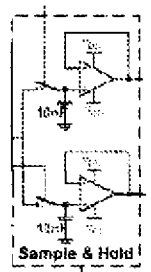

In Fig. 10, Sheet 10 of 13, for Tag "1016", delete " " and insert -- --, therefor.

In Fig. 10, Sheet 10 of 13, for Tag "1018", delete " 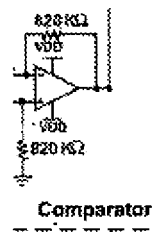 " and insert -- 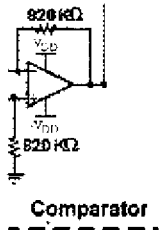 --, therefor.

In Fig. 13A, Sheet 13 of 13, delete "VDD" and insert -- $V_{DD}$ --, therefor.

In Fig. 13A, Sheet 13 of 13, delete "VCC" and insert -- $V_{CC}$ --, therefor.

In Fig. 13B, Sheet 13 of 13, for Tag "1354", in Line 1, delete "VDD" and insert -- $V_{DD}$ --, therefor.

In Fig. 13B, Sheet 13 of 13, for Tag "1354", in Line 1, delete "ΔVDD" and insert -- $\Delta V_{DD}$ --, therefor.

In Column 4, Line 29, delete "(VDD)" and insert -- ($V_{DD}$) --, therefor.

In Column 5, Line 24, in Equation (1), delete "D($V_{DD}$ Vth)" and insert -- D($V_{DD}$, $V_{th}$) --, therefor.

In Column 5, Line 27, delete "D($V_{DD}$ Vth)" and insert -- D($V_{DD}$, $V_{th}$) --, therefor.

In Column 11, Line 3, delete "ΔVth amount," and insert -- $\Delta V_{th}$ amount, --, therefor.

In Column 11, Line 4, delete "ΔVth can" and insert -- $\Delta V_{th}$ can --, therefor.

In Column 11, Line 7, delete "ΔVth." and insert -- $\Delta V_{th}$. --, therefor.

In Column 11, Line 9, delete "ΔVth." and insert -- $\Delta V_{th}$. --, therefor.

In Column 11, Line 9, delete "ΔVth" and insert -- $\Delta V_{th}$ --, therefor.

In Column 11, Line 64, delete "($T_{spec}$) If" and insert -- ($T_{spec}$). If --, therefor.

CERTIFICATE OF CORRECTION (continued)
U.S. Pat. No. 7,973,594 B2

In Column 13, Line 67, delete "of" and insert -- of $f_{sys}$, --, therefor.

In Column 17, Line 20, delete "node" and insert -- node (e.g., VGND) --, therefor.

In Column 17, Line 22, delete "14052," and insert -- 140Ω, --, therefor.